United States Patent
Yamauchi et al.

(10) Patent No.: US 7,807,538 B2
(45) Date of Patent: Oct. 5, 2010

(54) METHOD OF FORMING A SILICIDE LAYER WHILE APPLYING A COMPRESSIVE OR TENSILE STRAIN TO IMPURITY LAYERS

(75) Inventors: Takashi Yamauchi, Kanagawa (JP); Atsuhiro Kinoshita, Kanagawa (JP); Yoshinori Tsuchiya, Kanagawa (JP); Junji Koga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 11/898,295

(22) Filed: Sep. 11, 2007

(65) Prior Publication Data

US 2008/0179752 A1 Jul. 31, 2008

(30) Foreign Application Priority Data

Jan. 26, 2007 (JP) .............................. 2007-015990

(51) Int. Cl.
H01L 21/336 (2006.01)
(52) U.S. Cl. ...................... 438/300; 438/494; 438/503; 438/607; 257/411; 257/768; 257/E21.409; 257/E29.255
(58) Field of Classification Search ........................ None
See application file for complete search history.

(56) References Cited

U.S. PATENT DOCUMENTS

| | | | | |
|---|---|---|---|---|
| 7,112,848 B2* | 9/2006 | Lee | ............................. | 257/347 |
| 7,132,338 B2* | 11/2006 | Samoilov et al. | ............ | 438/300 |
| 7,173,312 B2* | 2/2007 | Cabral et al. | ................ | 257/369 |
| 7,202,122 B2* | 4/2007 | Huang et al. | ................. | 438/197 |
| 7,307,273 B2* | 12/2007 | Currie | ......................... | 257/18 |
| 7,314,804 B2* | 1/2008 | Lindert et al. | ............... | 438/305 |
| 2006/0057859 A1* | 3/2006 | Chen | .......................... | 438/765 |
| 2006/0118878 A1* | 6/2006 | Huang et al. | ................. | 257/369 |
| 2007/0034945 A1* | 2/2007 | Bohr et al. | .................... | 257/338 |
| 2007/0200179 A1* | 8/2007 | Chen | .......................... | 257/369 |
| 2008/0006818 A1* | 1/2008 | Luo et al. | ..................... | 257/19 |
| 2008/0119019 A1* | 5/2008 | Han et al. | .................... | 438/197 |

OTHER PUBLICATIONS

Ranade, et al., "High Performance 35nm $L_{gate}$ CMOS Transistors Featuring NiSi Metal Gate (FUSI), Uniaxial Strained Silicon Channels and 1.2 nm Gate Oxide", 2005 IEDM, Technical Digests, p. 1-4, (2005).

* cited by examiner

Primary Examiner—Zandra Smith
Assistant Examiner—Khanh B Duong
(74) Attorney, Agent, or Firm—Finnegan, Henderson, Farabow, Garrett & Dunner, L.L.P.

(57) ABSTRACT

A metal insulator semiconductor field effect transistor (MISFET) having a strained channel region is disclosed. Also disclosed is a method of fabricating a semiconductor device having a low-resistance junction interface. This fabrication method includes the step of forming a gate electrode above a silicon substrate with a gate insulator film being sandwiched therebetween. Then, form a pair of heavily-doped p ($p^+$) type diffusion layers in or on the substrate surface at both sides of the gate electrode to a concentration of $5\times10^{19}$ atoms/cm$^3$ or more and yet less than or equal to $1\times10^{21}$ atoms/cm$^3$. Next, silicidize the $p^+$-type layers by reaction with a metal in the state that each layer is applied a compressive strain.

9 Claims, 28 Drawing Sheets

Average B Concentration ratio near NiSi-side/near Si-side

PRIOR ART

PRIOR ART

PRIOR ART

PRIOR ART

METHOD OF FORMING A SILICIDE LAYER WHILE APPLYING A COMPRESSIVE OR TENSILE STRAIN TO IMPURITY LAYERS

CROSS-REFERENCE TO RELATED APPLICATION

This application is based upon and claims the benefit of priority from the prior Japanese Patent Application No. 2007-015990, filed Jan. 26, 2007, the entire content of which is incorporated herein by reference.

FIELD OF THE INVENTION

The present invention relates to a semiconductor device fabrication method for improvement of the source/drain regions of metal insulator semiconductor field effect transistors (MISFETs). This invention also relates to semiconductor devices as fabricated by the method.

BACKGROUND OF THE INVENTION

Silicon-based ultralarge-scale integrated (ULSI) circuitry is one of infra-technologies that support advanced information society in near future. For further functional improvement of ULSI circuits, it is inevitable to enhance performances of MISFETs, which are major elements of ULSI circuit devices. Traditionally the performance enhancement of on-chip circuit elements has fundamentally relied upon miniaturization and downscaling rules—i.e., proportional shrinkage of minimum feature sizes. In recent years, however, it is likely that this approach has almost reached physical limits and thus is faced with difficulties not only in achieving higher performances of circuit elements by miniaturization but also in retaining proper operations of such downscaled circuit elements per se.

One of such physical limits is a problem of parasitic resistance of source/drain (S/D) region. See FIG. 47, which shows a typical structure of prior known MISFET. As shown herein, a silicide film 110 is formed at S/D electrode, with a Schottky junction being formed between this silicide film 110 on one hand and a heavily-doped diffusion layer 108 around silicide 110 and its associated extension diffusion 105 on the other hand. In this case, the parasitic resistance of S/D electrode consists essentially of three resistance components: the silicide film 110's own resistance Rs, the heavily-doped layer 108's resistance Rd which is the so-called bulk film resistance, and the junction's interface resistance Rc.

Regarding the silicide film's own resistance Rs, the recent trend is to use a nickel silicide (NiSi) film, which is less in resistance than traditional titanium silicide ($TiSi_2$) and cobalt silicide ($CoSi_2$) films. This NiSi film is a technically attractive material owing to its advantages in addition to the low resistance: fabrication capability at low temperatures, shallow film formability with less consumption of silicon (Si) during silicidation, and usability as silicides for both N-channel and P-channel FETs due to the fact that the NiSi's work function is in close proximity to a mid gap of the energy bands of Si.

For reduction of the junction interface resistance Rc, it is known that it is important to increase the concentration of a doped impurity at the interface between the silicide film 110 and the heavily-doped Si layer 108 in the MISFET of FIG. 47. See FIG. 48, which is a band diagram of Schottky junction to be formed between silicide and heavily-doped Si films. An electron moves or "migrates" between these films by tunneling a peak of energy equivalent to the height of such Schottky barrier. The tunnel ability of this electron is generally called the tunnel probability among those skilled in the art. The higher the tunnel probability of junction interface, the lower the interface resistance.

It is also known that the tunnel probability decreases exponentially relative to a product of Schottky barrier height and tunneling distance. Reducing the Schottky barrier height and tunnel distance leads to a decrease in interface resistance. By increasing the impurity concentration at the interface between the silicide film and heavily-doped Si layer, the tunnel distance decreases due to occurrence of an effect for enhancing the curvature of Si layer band as shown in FIG. 49. And when image charge effect being taken into consideration, the Schottky barrier height per se is also reduced as apparent from FIG. 49. Obviously this results in a decrease in the product of Schottky barrier height and tunnel distance, thus reducing the interface resistance Rc.

One known NiSi layer forming process is shown in FIG. 50. This process includes the steps of forming in Si layer a pair of source/drain (S/D) diffusion regions and thereafter sputtering Ni onto these S/D regions for silicidation. Unfortunately this prior art process suffers from difficulty in increasing the impurity concentration at the interface between the silicide film 110 and heavily-doped Si layer 108—in particular, in the case of p-type Si.

Turning to FIGS. 51A and 51B, each graph shows a secondary ion mass spectroscopy (SIMS) observation result of the interface between a NiSi layer and heavily-doped Si layer as has been formed by the process shown in FIG. 50. As can be seen from FIG. 51A, in the case of an arsenic (As) dopant that is an n-type impurity for Si, a distribution of impurity concentration expands on both sides of the interface. In contrast, as shown in FIG. 51B, a p-type impurity doped—e.g., boron (B)—is distributed mostly within NiSi film, with its concentration on the Si side being extremely lowered. This is because B impurity is taken into NiSi film during silicidation. As apparent from the observation results, it remains difficult for prior art NiSi layer formation processes to reduce the junction interface resistance Rc.

From the viewpoint of performance enhancement of MISFETs as required by the proportional downscaling rules for ULSI chips, it is also important to improve the carrier mobility of the channel region underlying the insulated gate electrode. Regarding this, new types of transistor structures have been proposed until today. Especially, for P-channel MISFETs (PMISFETs) having high impurity concentration S/D regions with an acceptor being doped thereinto, the promising approach is to use a device structure having its S/D regions in which silicon germanium ($Si_xGe_{1-x}$, where the suffix "x" is zero or a positive number less than one) is buried, as taught from P. Ranade et al., "High Performance 35 nm $L_{GATE}$ CMOS Transistors Featuring NiSi Metal Gate (FUSI), Uniaxial Strained Silicon Channels and 1.2 nm Gate Oxide," Technical Digest of the International Electron and Devices Meeting, IEDM 2005, paper 10.1, pp 227-230. It is known that use of this device structure leads to improvements in carrier mobility because the channel region is applied a stress due to a deviation of lattice constant between Si and SiGe layers.

As apparent from the foregoing description, in order to improve the MISFET characteristics, a need is felt to provide a device structure and its fabrication process for lowering the electrical resistance of the interface of a heavily-doped layer and its associated metal silicide layer in S/D region of MISFET. In particular, in order to enhance the carrier mobility, it has been demanded to develop a new and improved semiconductor device best suited to the MISFET with the strain-added channel region along with a fabrication process thereof.

SUMMARY OF THE INVENTION

It is therefore an object of this invention is to provide a semiconductor device which includes a MISFET having a strained channel region and which is capable of lowering the electrical resistance of a junction interface of the MISFET. Another object is to provide a method of making the semiconductor device.

In accordance with one aspect of this invention, a method of making a semiconductor device includes the steps of forming a gate insulating film above a semiconductive substrate, forming a gate electrode on the gate insulating film, forming in or on the substrate at both sides of the gate electrode a pair of spaced-apart heavily-doped impurity layers of p-type conductivity to a concentration ranging from $5 \times 10$ to $1 \times 10^{21}$ atoms per cubic centimeter (/cm³), and forming a silicide layer by causing each heavily-doped impurity layer to react with a metal while simultaneously applying thereto a compressive strain.

In accordance with another aspect of the invention, a method of fabricating a semiconductor device includes the steps of forming a gate insulating film above a semiconductive substrate, forming a gate electrode on the gate insulating film, forming in or on the substrate at both sides of the gate electrode a pair of spaced-apart heavily-doped impurity layers of n-type conductivity to a concentration ranging from $5 \times 10$ to $1 \times 10^{21}$ atoms/cm³, and causing the heavily-doped impurity layers to react with a metal while applying thereto a tensile strain to thereby form a silicide layer.

In accordance with a further aspect of the invention, a semiconductor device includes a channel region in a semiconductor substrate, a gate insulating film above the channel region, a gate electrode on the gate insulating film, a $Si_xGe_{1-x}$ (where $0 \leq x < 1$) at both sides of the channel region, a heavily-doped impurity layer of p-type conductivity residing between the channel region and the $Si_xGe_{1-x}$ layer and having an impurity concentration ranging from $5 \times 10^{19}$ to $1 \times 10^{21}$ atom/cm³, and a layer of metal silicide on the heavily-doped impurity layer. The impurity concentration is higher than a concentration of the impurity in the metal silicide layer.

In accordance with another further aspect of the invention, a semiconductor device includes a channel region in a semiconductor substrate, a gate insulating film above the channel region, a gate electrode on the gate insulating film, a $Si_xC_{1-x}$ layer (where $0 \leq x < 1$) at both sides of the channel region, a heavily-doped impurity layer of n-type conductivity residing between the channel region and the $Si_xC_{1-x}$ layer and having an impurity concentration ranging from $5 \times 10^{19}$ to $1 \times 10^{21}$ atom/cm³, and a layer of metal silicide on the heavily-doped impurity layer, wherein the impurity concentration is higher than a concentration of the impurity in the metal silicide layer.

In accordance with the invention, it is possible to provide the semiconductor device which includes a MISFET having a strained channel region and which is capable of achieving the low-resistance junction interface of the MISFET and also provide the fabrication method of the device.

DETAILED DESCRIPTION OF THE INVENTION

Figure 49:
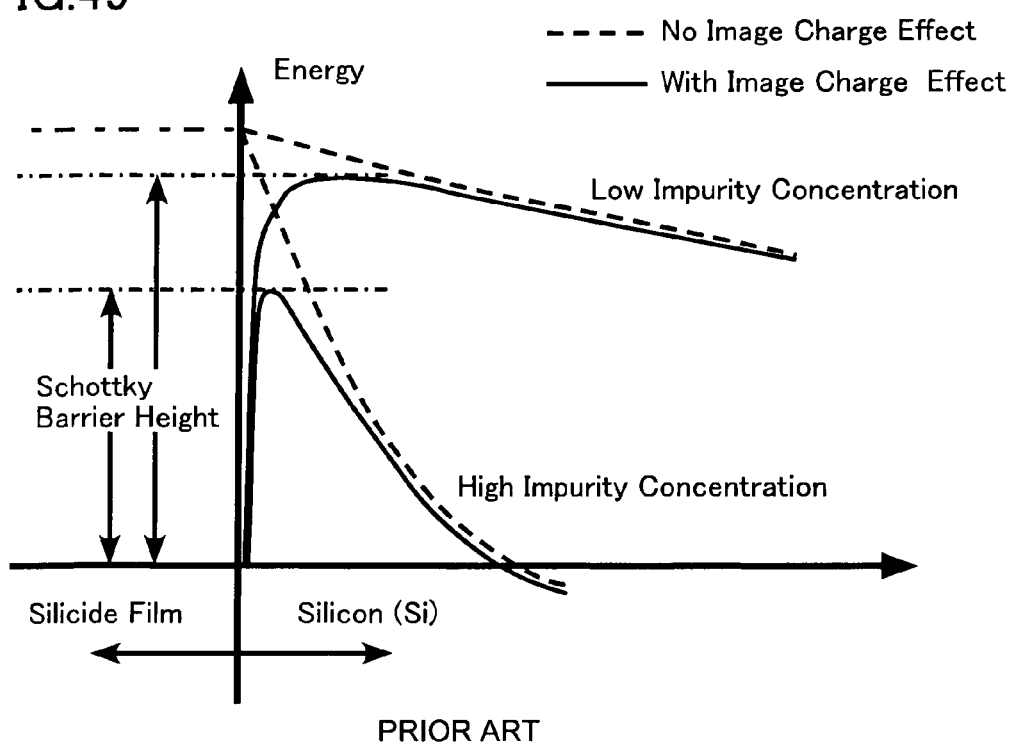
FIG. 49 is a diagram graphically showing how the curvature of Si layer varies depending on a difference in impurity concentration of Si layer.
Figure 50:
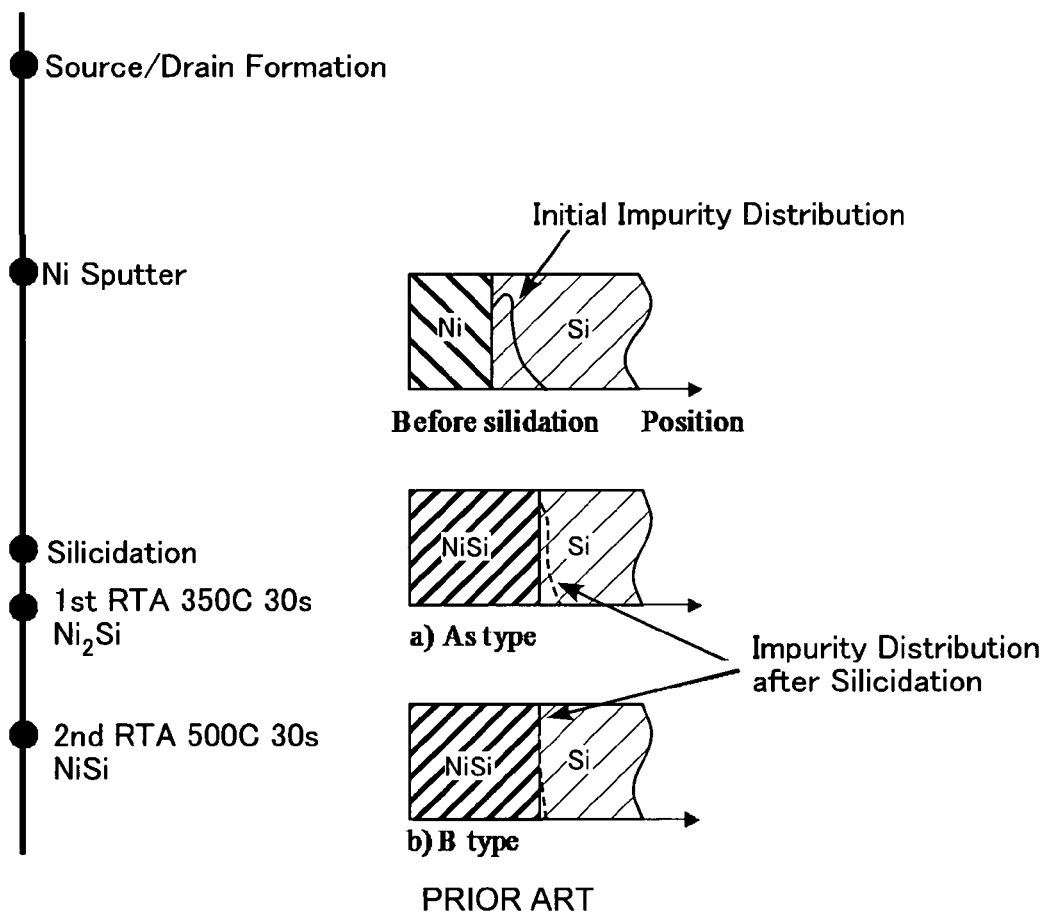
FIG. 50 shows a flow of prior art NiSi layer-forming process.

It has been found by the inventors that it is possible by performing metal silicidation while at the same time letting a silicon (Si) layer be applied a distortion or strain to form a heavily-doped active layer at an interface between a silicide layer and Si layer on the Si layer side. Realizing such the interface induces an effect of enhancing the curvature of the conduction band of Si layer as demonstratively shown in FIG. 49. This makes it possible to appreciably reduce and lower the electrical resistance of the silicide/Si interface.

An important principal concept of this invention lies in using the low-resistance interface formed by the strain-applied Si layer silicidation technique for semiconductor devices and fabrication processes thereof.

First, an explanation will be given of the principle of the fact that execution of metal silicidation in a state that strain or distortion is applied to Si layer enables formation of a heavily-doped active layer on the Si layer side at an interface between silicide and Si layers.

First, in order to investigate the behavior of a p-type impurity—e.g., boron (B)—in the state that strain is applied, calculation was done for comparison to quantitatively determine the B atom's formation energy, i.e., energy gain, obtainable when B atom moves from a vacuum to a substitutional site for a Si atom in a Si layer along with B atom's formation energy when moving from the vacuum to substitutional site for a Si atom in a NiSi layer. Basically, the B atom is more readily movable to a layer which is greater in energy gain. In light of this fact, it becomes possible to obtain a layer for segregation of B atom during silicidation.

Next, in order to clarify a difference of B atom's segregation due to a difference in strain being applied to Si layer, computation was done to determine a change in B atom's formation energy due to a difference of lattice constant in Si layer. Note here that regarding the change of Si layer's lattice constant, the computation was limited to a range of plus/minus (±) 1% because this range is the actually occurrable one in semiconductor devices or semiconductor device fabrication processes. Also note that the computation was carried out by using a technique of the so-called spin-polarized generalized-gradient approximation (SP-GGA).

In the case of the B impurity entering at the substitutional site for a Si atom of Si layer, the formation energy is represented by:

$$E_f^{Si(Si)} = -Ea - Eb + Ec + Ed,$$

where Ea is the energy of a cell structure which consists of 63 Si atoms while containing therein a single impurity atom, Eb is the energy of a single Si atom in a bulk, Ec is the energy of a cell structure of 64 Si atoms, and Ed is the energy of one impurity atom in a vacuum.

Note that when the impurity atom enters at the substitutional site for a Si atom, the calculation was executed under an assumption that a lattice point-exited Si atom behaves to return to the Si bulk layer again. And the calculation was executed using a $Si_{64}$ unit Next, in case the B impurity atom enters for substitution with a Si atom in NiSi layer, the formation energy is given as:

$$E_f^{Si(NiSi)} = -Ep - Eb + Eq + Ed,$$

where, Ep is the energy of a cell structure consisting of 32 NiSi particles with one Si atom replaced by B atom, and the Eq is the energy of a cell structure of 32 NiSis. The calculation was performed here by use of a model of the unit lattice of $Ni_{32}Si_{32}$.

Figure 2:
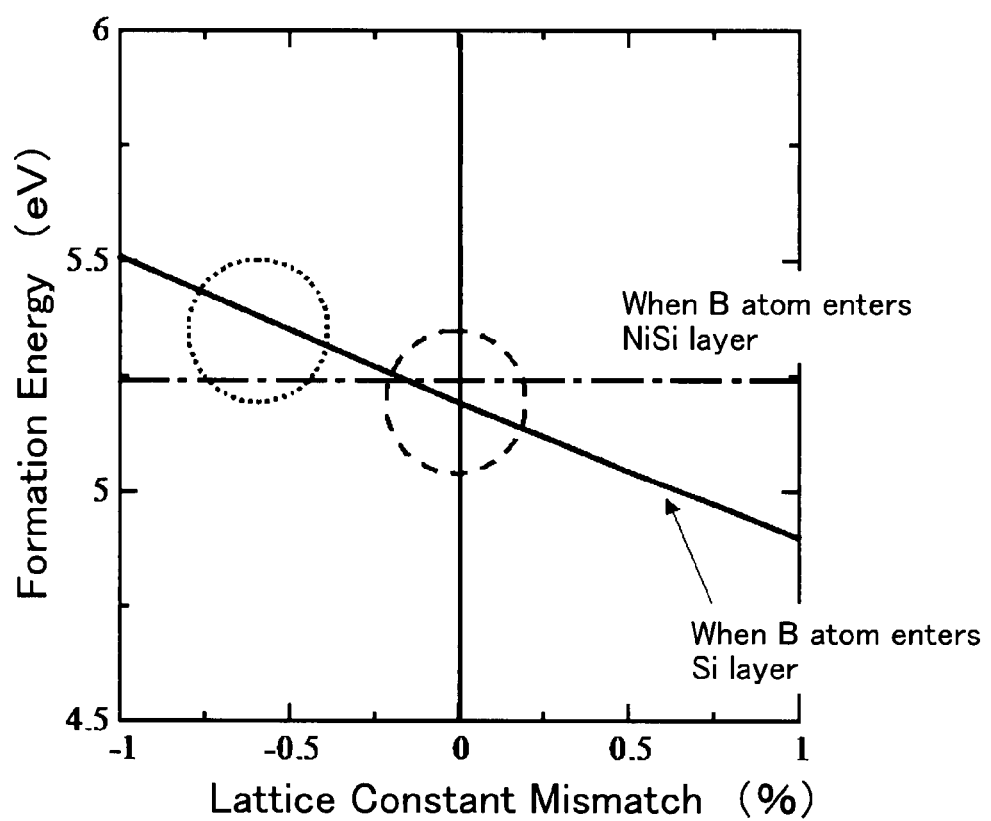
FIG. 2 is a diagram graphically showing a curve of formation energy of a boron (B) atom entering a silicon (Si) layer versus lattice constant mismatch, which energy was obtained by simulation calculation.

The calculated formation energies are graphically shown in FIG. 2. The lateral axis of this graph indicates a lattice constant deviation from the lattice constant (0.543 nm) of Si layer with no strain being applied thereto (lattice constant mismatch), wherein positive values plotted are equivalent to tensile strain whereas negative values are to compressive strain. A dash-dot line in this graph denotes the formation energy when B atom enters into NiSi layer.

Figure 51A:
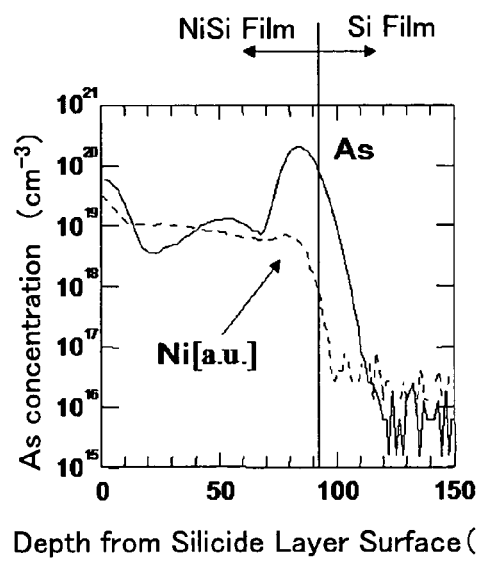
FIGS. 51A-51B are graphs each showing backface secondary ion mass spectroscopy (SIMS) observation results by an interface between NiSi layer and heavily-doped Si layer.
Figure 51B:
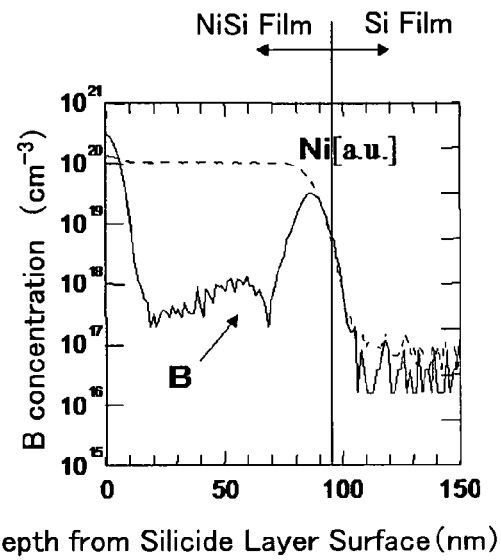

As apparent from FIG. 2, in case no strain is applied to Si layer, the formation energy $E_f^{Si(NiSi)}$ becomes greater in value than the energy $E_f^{Si(Si)}$. This suggests that B atom exhibits segregation into NiSi layer during silicidation. In prior art silicidation processes under application of no strain, occurrence of this phenomenon results in B atom segregating in NiSi layer as shown in FIG. 51B.

However, it has been found that when compressive strain is applied to Si layer resulting in the lattice deviation becoming 0.2% or more, the large/small relation of the formation energy values $E_f^{Si(NiSi)}$ and $E_f^{Si(Si)}$ becomes reversed: $E_f^{Si(si)}$ is larger than $E_f^{Si(NiSi)}$. Supposedly, this is because the crystal obtained by entry of B atom into the compressively strained Si layer is energetically stabled as B atom is smaller in size than Si atoms.

This encourages us to believe that performing silicidation with application of compressive strain forces B atom to segregate in Si layer. Consequently, in the case of B atom, use of the compressive strain-applied silicidation technique makes it possible to reduce the electrical resistance of an interface between NiSi and Si layers.

Regarding an n-type impurity, such as arsenic (As), our investigation revealed that similar results are obtainable by replacing the Si layer-applied compressive distortion with tensile distortion as will be discussed in detail later.

Figure 3:
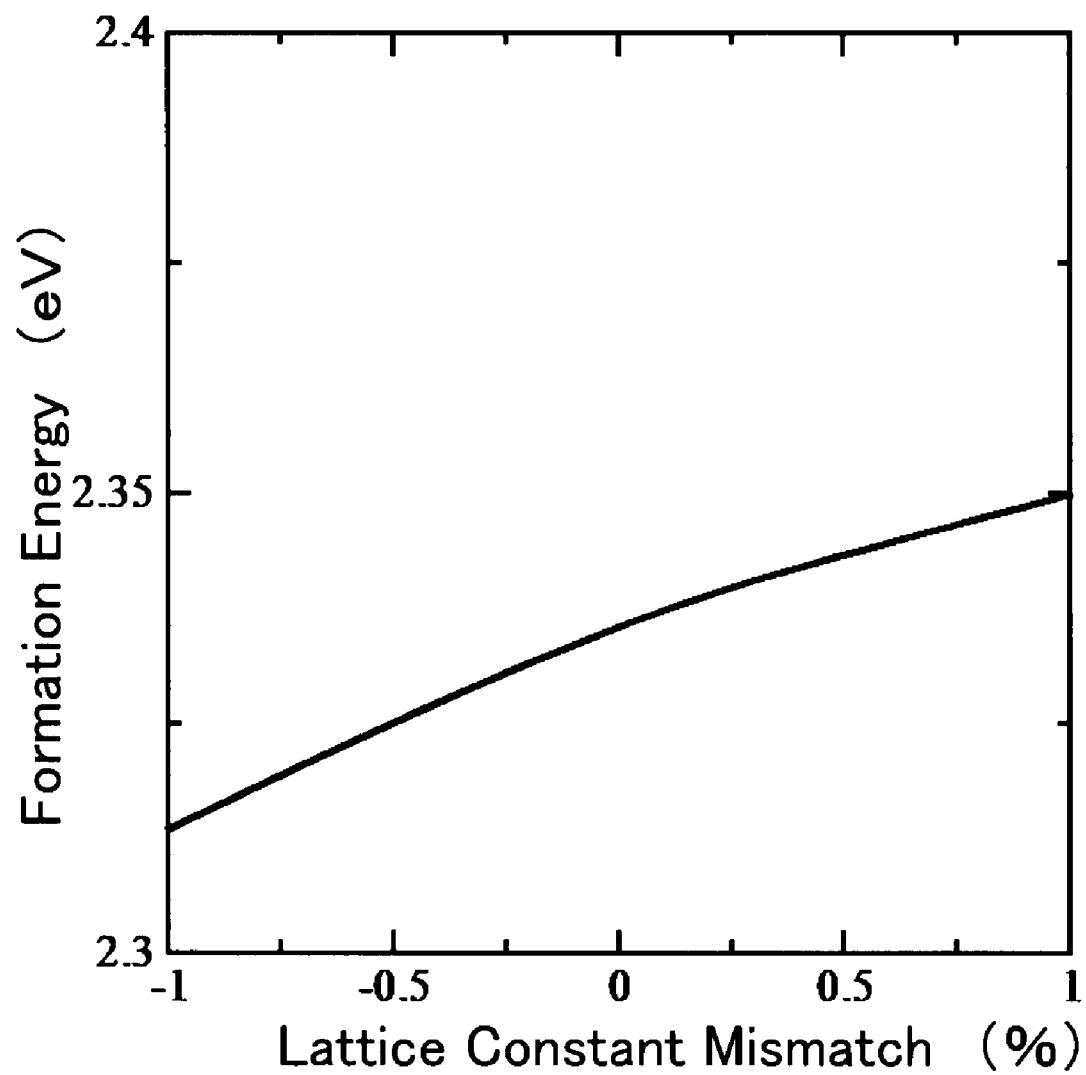
FIG. 3 is a graph showing a calculated curve of formation energy of a Si layer-entering arsenic (As) atom versus lattice constant.

See FIG. 3, which graphically shows a calculation result of the formation energy when As atom enters into Si layer. It is apparent from viewing this graph that unlike B atom, even when varying the lattice constant within the range of ±1%, the formation energy is at 0.05 eV or less. In other words, its change is kept less. However, it was revealed that performing silicidation under application of tensile distortion or strain to Si layer enables As atom to segregate in Si monolayer. Thus, in the case of As atom, the NiSi/Si layer interface is appreciably reducible in electrical resistance by the tensile strain-applied silicidation process.

Embodiment 1

Figure 4:
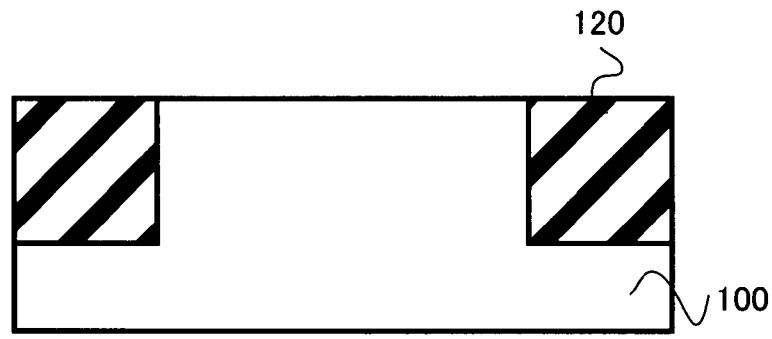
FIGS. 4 through 11 illustrates, in cross-section, some major steps in the manufacture of the semiconductor device shown in FIG. 1.

A fabrication process of the PMISFET shown in FIG. 1 will be described with reference to FIGS. 4 to 11 below. Firstly as shown in FIG. 4, an n-type silicon (Si) substrate 100 is prepared, which has its top surface corresponding to a (100) crystal plane and which is doped with phosphorus (P) to a concentration of about $10^{15}$ atoms/cm$^3$. Then, form in the substrate surface a film of silicon oxide (SiO$_x$) which provides shallow trench isolation (STI) regions 120 for electrical separation of circuit elements. Thereafter, form thereon a gate insulating film 101 to an equivalent oxide thickness (EOT) of about 1 nm. Next, deposit on this film a polycrystalline silicon or "poly-Si" film to a thickness of about 100 to 150 nm, by low-pressure chemical vapor deposition (LPCVD) techniques.

Figure 5:
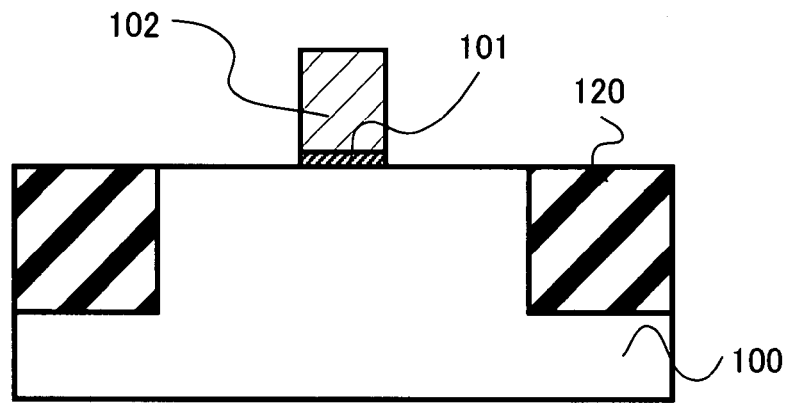

Then, as shown in FIG. 5, use lithography and etch techniques, such as reactive ion etching (RIE), to pattern the gate insulating film 101 and gate electrode 102 so that the resulting gate length is about 30 nm. If necessary, perform post-oxidation of 1 to 2 nm.

Figure 6:
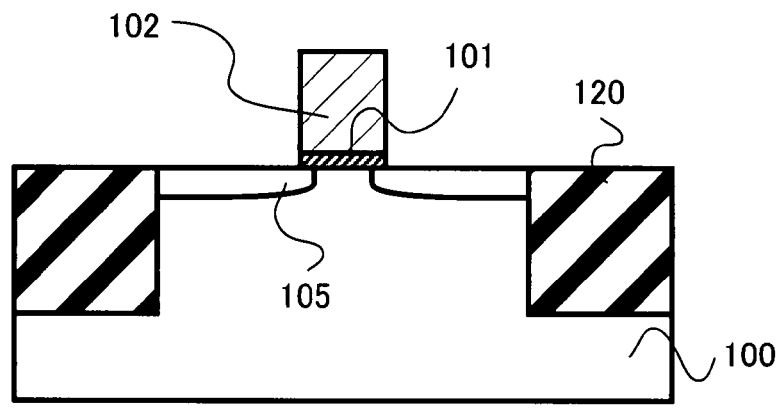

Next, as shown in FIG. 6, with the patterned gate insulator film 101 and gate electrode 102 as a mask, dope boron (B) by ion implantation into the exposed substrate surface to thereby form a pair of extension diffusion layers 105 with B doped to a concentration of $10^{20}$ atoms/cm$^3$. Then, perform activation annealing, such as spike anneal, at a temperature of about 1050° C.

Figure 7:
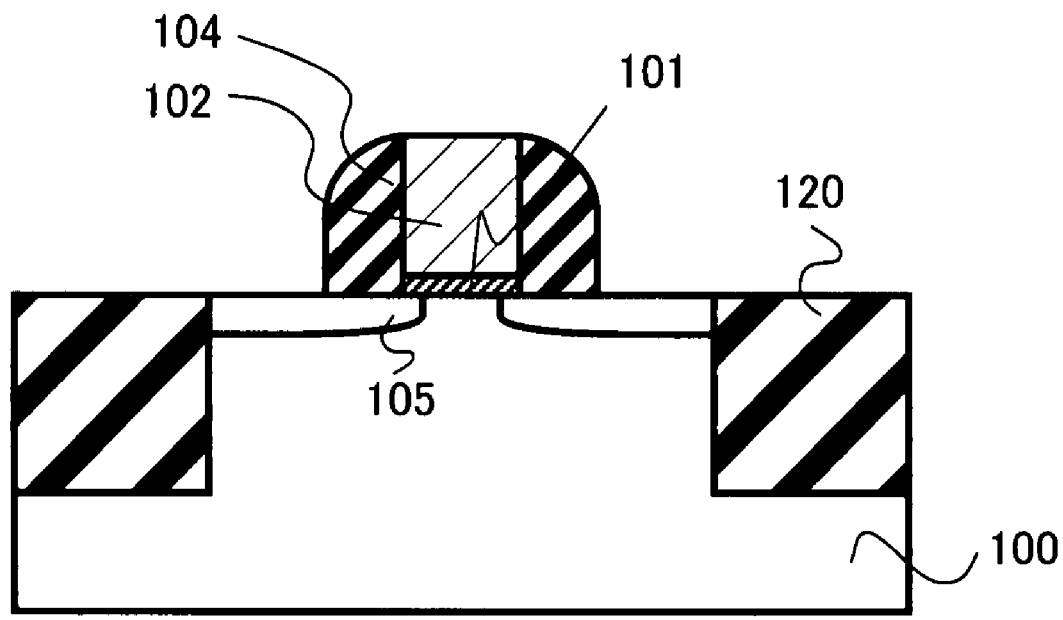

Next as shown in FIG. 7, after having deposited by LPCVD a silicon nitride (SiN) film to a thickness of about 8 nm, apply etch-back treatment by RIE in such a way that the SiN film is selectively remained only at the opposite sidewall faces of gate electrode 102, thereby forming a "first" gate sidewall insulator film 104.

While the gate sidewall insulator film 104 of FIG. 7 is of the SiN monolayer structure, this film 104 may alternatively be designed to be a double-layered or multilayered structure. An example is a stacked layer of 3-nm thick tetra-ethyl-orthosilicate (TEOS) oxide film and 5 nm thick SiN film. Using this TEOS/SiN stack is effective in suppression of unwanted carrier trapping into the surface below sidewall insulator 104, which leads to an increase in reliability.

Figure 8:
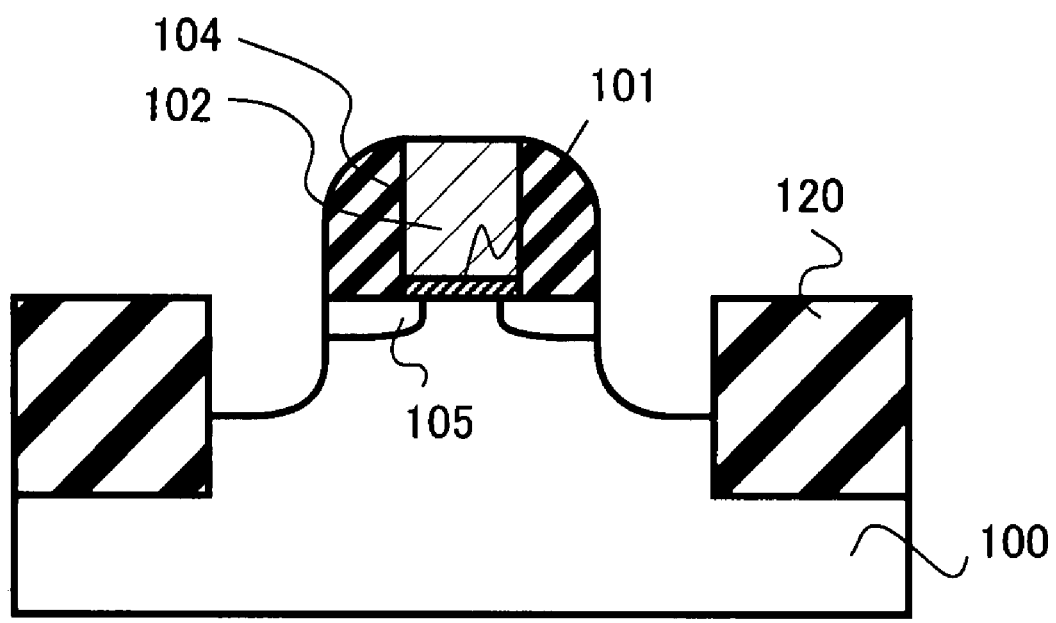

Next as shown in FIG. 8, with the gate electrode 102 and sidewall insulator film 104 as a mask, perform selective etching to dig down selected portions of the extension diffusion layer 105 and Si substrate 100 to a depth of about 30 nm. At this step, it is a good ideal to provide a patterned masking material on poly-Si gate electrode 102 in order to avoid overetching of gate electrode 102.

Figure 9:
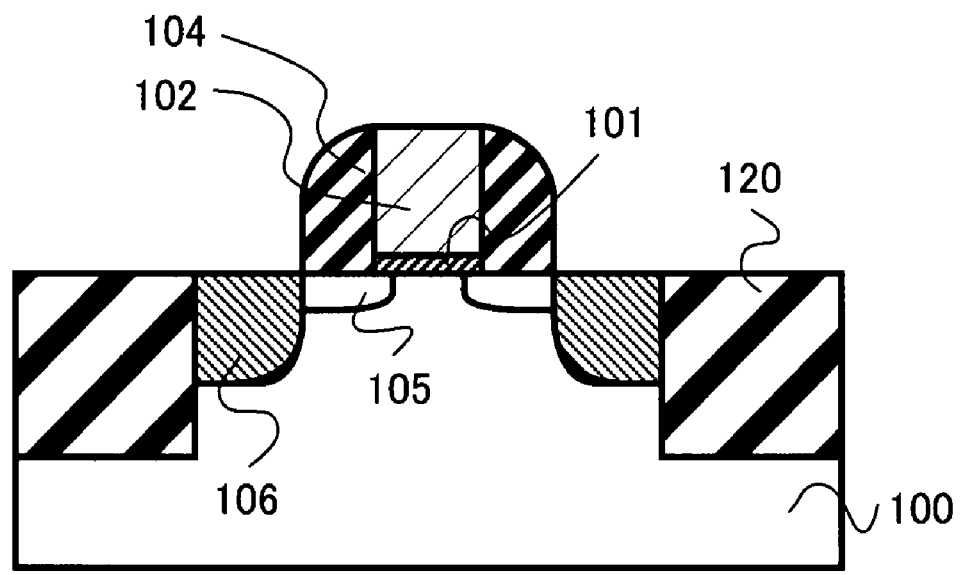

Next as shown in FIG. 9, let a silicon germanium layer 106 epitaxially grow selectively in the etched recesses with respect to a crystal layer on the Si substrate side. The silicon germanium is represented by $Si_xGe_{1-x}$ (where the suffix "x" is 0 or a positive number less than 1, i.e., $0 \leq x<1$). After completion of the selective epitaxial growth, remove the first gate sidewall insulator film 104 by chemical dry etch (CDE) techniques. Thereafter, again form a gate sidewall insulator film 107 on the both side faces of gate electrode 102 through LPCVD and RIE processes.

Figure 10:
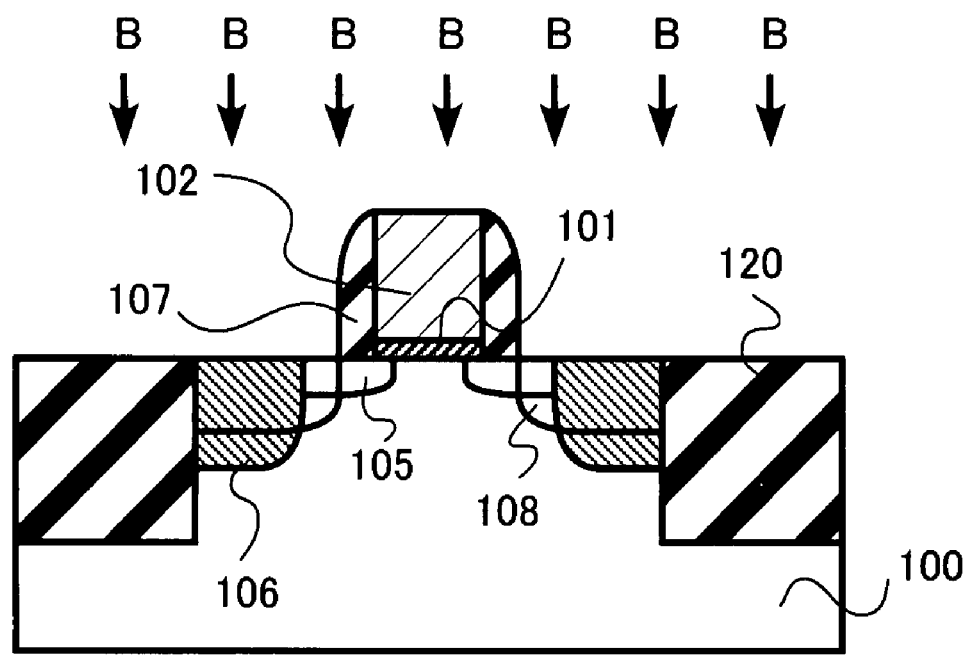

Subsequently, as shown in FIG. 10, with the gate electrode 102 and the "second" gate sidewall insulator film 107 as a mask, dope B atoms by ion implantation into the substrate surface, thereby forming a pair of heavily-doped p (p+) type impurity diffusion layers 108. Thus, the $p^+$-type diffusions 108 formed are substantially self-aligned with the sidewall insulator-added gate electrode 102 so that each partly overlaps its corresponding $Si_xGe_{1-x}$ layer 106. As can be seen from FIG. 10, the individual $p^+$-type diffusion 108 has its portion residing in a specific location between the gate electrode 102 and $Si_xGe_{1-x}$ layer 106 associated therewith.

Preferably at this time, the B concentration of $p^+$-type diffusion layers 108 is set to greater than or equal to $5 \times 10^{19}$ and yet less than or equal to $1 \times 10^{21}$ atoms/cm³—more preferably, $5 \times 10^{20}$ atoms/cm³. This can be said because letting B concentration be less than this range would result in failure of achievement of sufficiently low electrical resistance of the interface between the silicide and Si layers at a later stage; adversely, setting it to higher than the range gives rise to difficulties due to exceeding of the solubility limit. Note that at this time, the $p^+$-type diffusions 108 are under application of a compressive distortion or strain due to the presence of the $Si_xGe_{1-x}$ layers 106.

Figure 11:
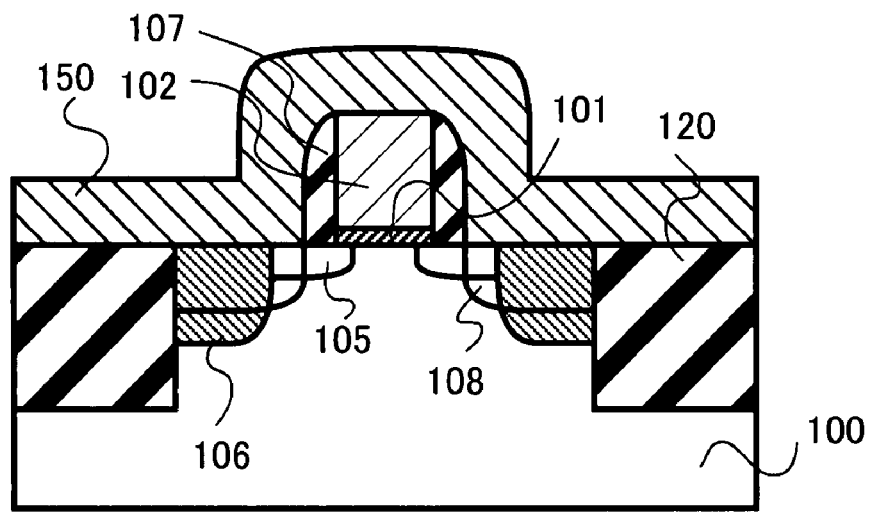

Next as shown in FIG. 11, after having sputtered a nickel (Ni) film 150 of 10 nm thick, apply a 400° C., 30 sec anneal and then perform selective film removal or "peel-off" using a chosen chemical solution.

Figure 1:
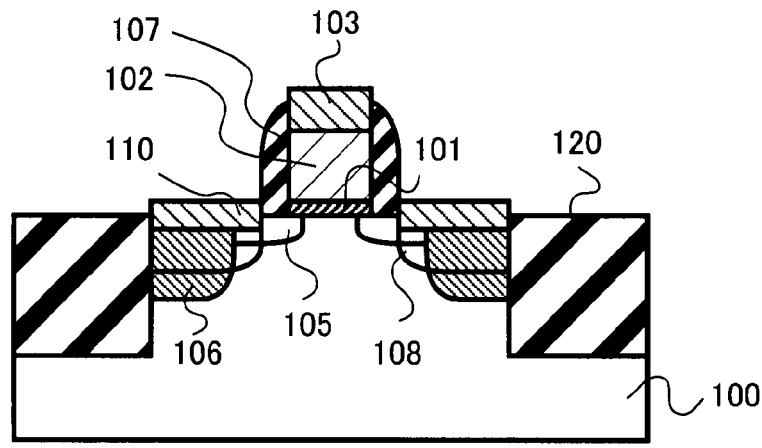
FIG. 1 is a diagram depicting, in cross-section, a semiconductor device in accordance with first embodiment of this invention.

With the fabrication process above, the semiconductor device shown in FIG. 1 is obtained, which has a pair of nickel silicide (NiSi) layers 110 for use as source/drain (S/D) electrodes and a gate silicide 103 which are formed in a self-aligned manner by reaction of the Ni film 150 with the poly-Si gate electrode 102 and extension diffusion layer 105 plus $p^+$-type diffusions 108.

Preferably the process conditions and parameters concerned are carefully designed to ensure that during formation of the NiSi layer by silicidation, the lattice constant of the heavily-doped $Si_xGe_{1-x}$ layers 106 is deviated by 0.2 to 1.0 percent (%) from its lattice constant under application of no compressive strain—more precisely, a deviation amount of the former from the latter is more than or equal to 0.2% and yet less than or equal to 1.0%. This value setting is required because setting it below this range results in the lack of an ability to sufficiently lower the electrical resistance of the NiSi/Si layer interface due to the fact that B dopants in $p^+$-type diffusion layers 108 segregate not on the Si layer side but on the NiSi side. On the contrary, setting the lattice constant mismatch to go beyond this range would result in occurrence of strain-caused crystal defects, which leads to the risk of reduction of manufacturing yields of the semiconductor device.

With the device fabrication method stated above, the $p^+$-type diffusion layers 108 are silicided while at the same time being applied compressive strain, so B atoms doped behave to segregate into Si layer side during silicidation, resulting in the B concentration on Si layer side becoming higher than that on NiSi layer side. Accordingly, unlike prior known NiSi layer forming methods, B dopants are hardly segregated into NiSi layer. Thus it becomes possible to appreciably increase B concentration near or around the substrate-side interface of NiSi layer. This makes it possible to reduce the electrical resistance of NiSi/Si layer interface.

A semiconductor device fabricated by the method has the structure shown in FIG. 1. This device has a silicon substrate 100, a channel region defined therein, a gate electrode 102 insulatively overlying the channel region with a gate insulator film 101 sandwiched therebetween, a pair of laterally spaced-apart $Si_xGe_{1-x}$ ($0 \leq x<1$) layers 106 at both sides of the channel, a couple of $p^+$-type diffusion layers 108 each being formed between the channel region and its corresponding $Si_xGe_{1-x}$ layers 106 in the substrate surface with B impurity being doped therein to a concentration of $5 \times 10^{19}$ to $1 \times 10^{21}$ atoms/cm³, and a pair of NiSi layers 110 being formed at the top surfaces of $p^+$-type diffusions 108. A structural feature of this device is that the B impurity concentration of $p^+$-type diffusions 108 is higher than the impurity concentration of NiSi layers 110.

Figure 12:
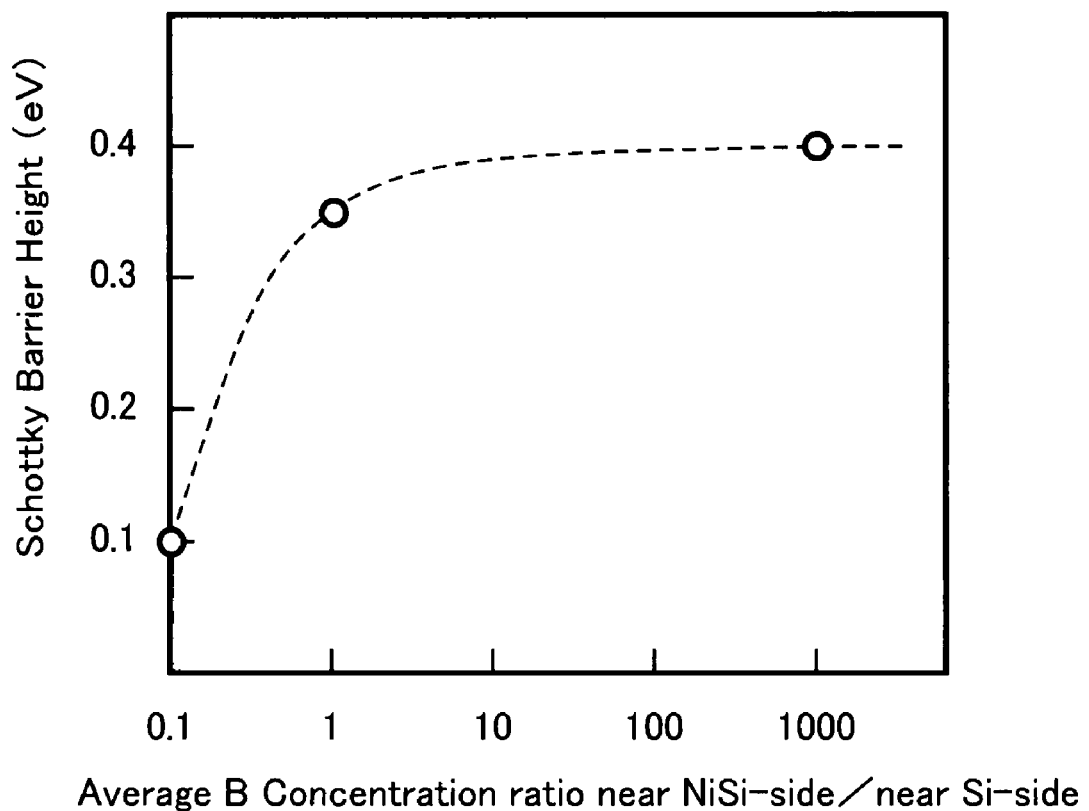
FIG. 12 is a graph showing a plot of Schottky barrier height of an interface versus the ratio of a concentration of B in nickel silicide (NiSi) layer to a concentration of B in Si layer.

In order to affirm the interface resistance reducibility owing to the fact that the Si layer side is higher in B concentration than NiSi layer side, the above-stated first principle-based calculation is performed to quantitatively determine the relationship between a ratio of average B concentration in vicinity of NiSi layer side interface to that near Si layer side interface and the height of Schottky barrier of the interface. Calculation results are shown in FIG. 12. Note here that the expression "in vicinity of" or "near" is used to refer to a distance of 20 nm from the interface, or more or less.

It is apparent from viewing the graph of FIG. 12 that the interface's Schottky barrier rapidly decreases in height when the ratio of average B concentration becomes less than one (1), that is, when the average B concentration on the Si layer side is higher than that on the NiSi layer side. Accordingly, the device structure of FIG. 1 has noticeably lowered electrical resistance at its NiSi/Si layer interface. This serves to increase a transistor drive current, thereby to improve operation characteristics thereof.

It is also apparent from FIG. 1 that in the embodiment device structure, a NiSiGe layer is actually formed on $Si_xGe_{1-x}$ layer 106 whereas a NiSi layer is on $p^+$-type diffusion 108. Note here that an interface between NiSiGe and NiGe layers does not always become low in resistance. Fortunately, as the low-resistance NiSi/Si layer resides between the gate electrode and SiGe layer, i.e., between the channel region and SiGe layer, holes that contribute to real conduction behave to enter into NiSi layer from the channel via the heavily-doped impurity (B) layer. Consequently, the formation of the low-resistance NiSi/Si layer interface largely contributes in effect to reducing the parasitic resistance of transistor.

Another advantage of the PMISFET of FIG. 1 is that its majority carriers, i.e., holes, are improved in mobility as the channel region receives the compressive strain inducted by the SiGe layer. This hole mobility increase is also devoted to improvements in transistor characteristics.

It has been stated that the semiconductor device and its fabrication method incorporating the principles of this invention are capable of achieving low-resistance junction interface in S/D region of MISFET having the strained channel region, thereby improving transistor characteristics, which leads to achievement of high-performance semiconductor devices.

Note that in this embodiment, the description of it assumes that an example of the $Si_xGe_{1-x}$ layer 106 is a SiGe layer, where the suffix "x" is set at 0.5, although the value x may alternatively be set to other numbers as far as it falls within the range of $0 \leq x < 1$, such as $Si_{0.1}G_{0.9}$, $Si_{0.2}G_{0.8}$, $Si_{0.3}G_{0.7}$, etc. Also note that regarding the NiSi layer for use as S/D silicide layer, this may be replaceable by any available Ni-containing silicide layer. In this case also, similar results are still obtainable.

Embodiment 2

A semiconductor device fabrication method also embodying the invention is shown in FIGS. 13 to 16. This method is similar in principles to that shown in FIGS. 4-11, with the heavily B-doped active layers of PMISFET being formed by an epitaxial growth technique rather than the ion implantation in a way as will be described below.

Figure 13:
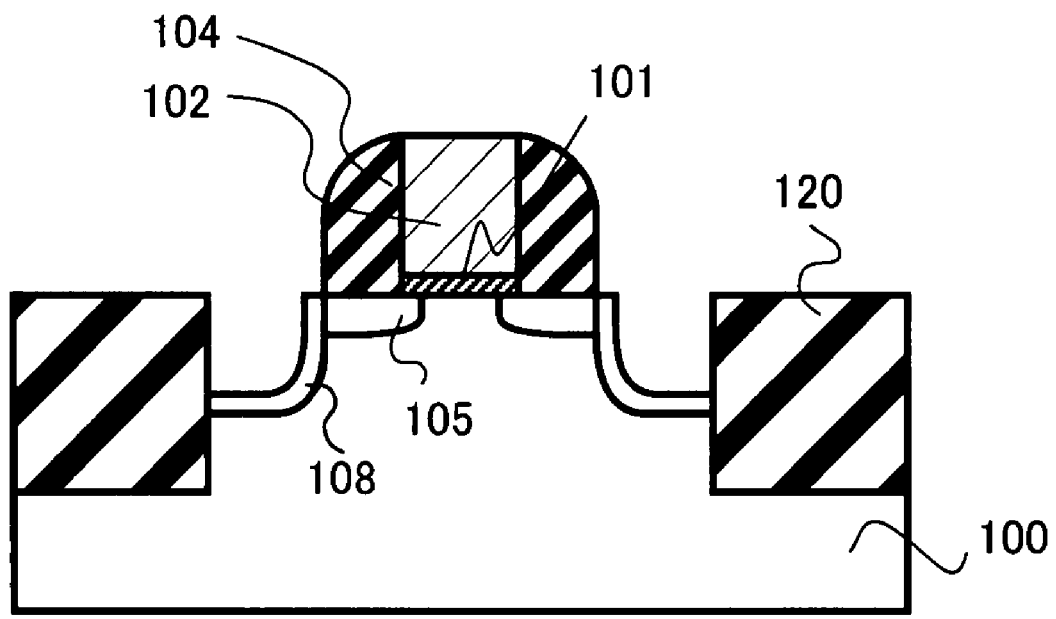
FIGS. 13 to 16 illustrates, in cross-section, major process steps in the fabrication of a semiconductor device in accordance with second embodiment of the invention.

After having performed the process steps shown in FIGS. 4-8, selective epitaxial growth is performed with mixture of a raw material gas of boron (B) to thereby form a couple of heavily B-doped thin diffusion layers 108 of $p^+$-type conductivity on the exposed surfaces of recesses in Si substrate 100 as shown in FIG. 13. The $p^+$-type diffusions 108 are $5 \times 10^{20}$ or more in impurity concentration.

Figure 14:
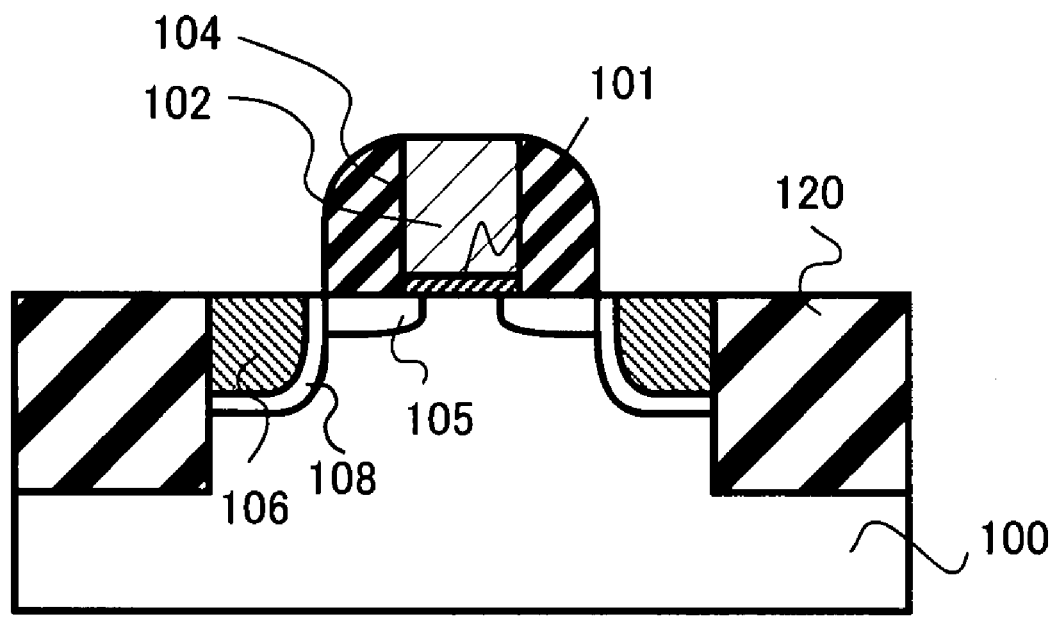

Then, as shown in FIG. 14, after having formed the $p^+$-type thin diffusion layers 108, change the raw gas to permit $Si_xGe_{1-x}$ layers 106 (where $0 \leq x < 1$) to epitaxially grow selectively on diffusions 108 to fill the recesses in Si substrate 100. At this time the underlying $p^+$-type diffusions 108 are applied a compressive distortion or strain due to the presence of the epitaxial growth SiGe layers 106.

Figure 15:
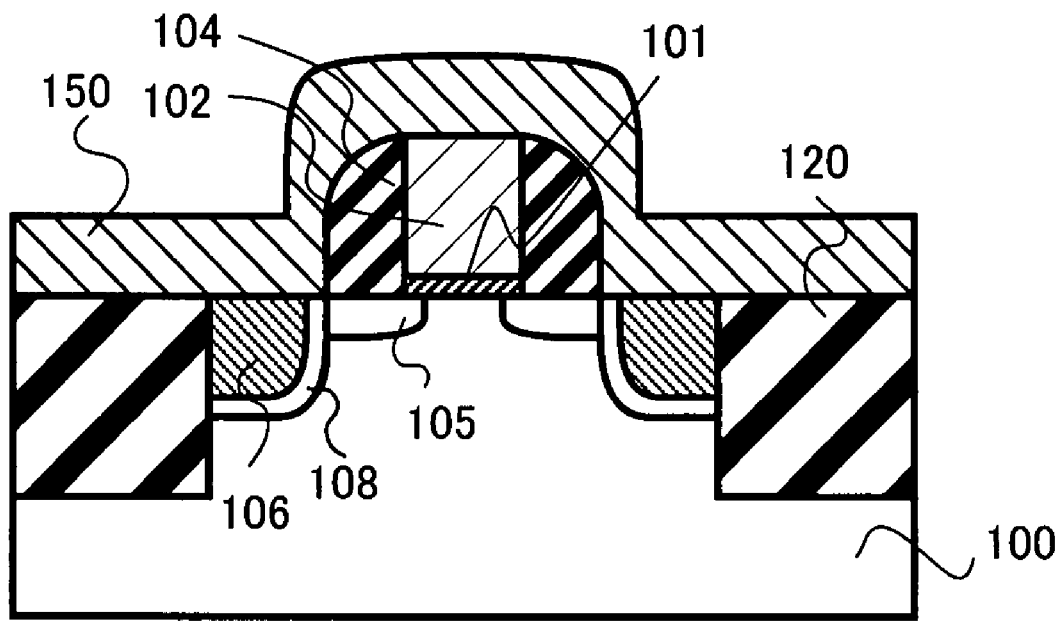

Next, as shown in FIG. 15, perform sputtering to form a nickel (Ni) film 150 of about 10 nm thick, followed by execution of a 400° C., 30 sec anneal process using a chosen chemical solution for selective removal of Ni film 150. By the process above, a pair of patterned NiSi layers 110 for later use as S/D electrodes and a gate silicide 103 on poly-Si gate electrode 102 are formed in a self-aligned manner while causing NiSi film 150 to react with $p^+$-type diffusions 108, SiGe layers 106 and gate electrode 102 as shown in FIG. 16.

In this embodiment also, silicidation is performed in the state that the heavily B-doped diffusion layer is compressively strained. Thus the resulting NiSi/Si layer interface is lowered in electrical resistance, thereby improving MISFET characteristics and thus characteristics of the semiconductor device fabricated. Another advantage of this embodiment method lies in its ability to perform the required processes using the same epitaxial growth equipment by merely changing SiGe layer and raw gas. This makes it possible to reduce manufacturing costs of the semiconductor device.

Figure 16:
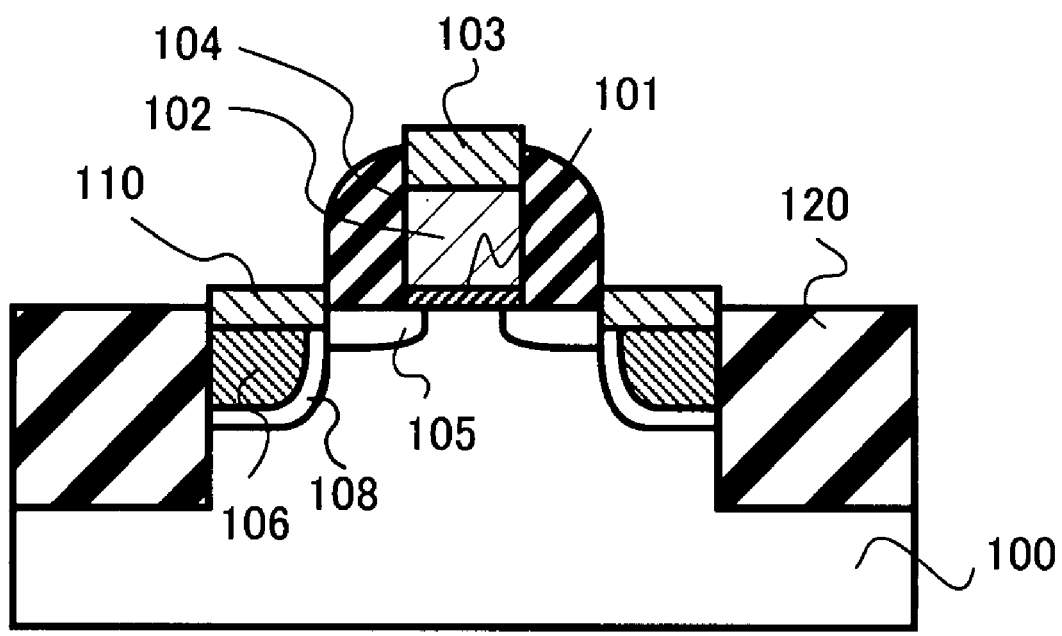

Regarding the semiconductor device having the structure shown in FIG. 16 that is fabricated by the embodiment method, this device is arranged so that the low-resistance NiSi/Si layer interface is provided between the gate electrode and SiGe layer to thereby improve the MISFET characteristics as in the previous embodiment.

Embodiment 3

A semiconductor device fabrication method in accordance with still another embodiment of the invention is shown in FIGS. 17 to 21. This method is similar to that stated supra with reference to FIGS. 13-16, except that B ion is heavily doped into an entirety of SiGe layer during the epitaxial growth of SiGe layer of PMISFET and that no extension layers are formed.

Figure 17:
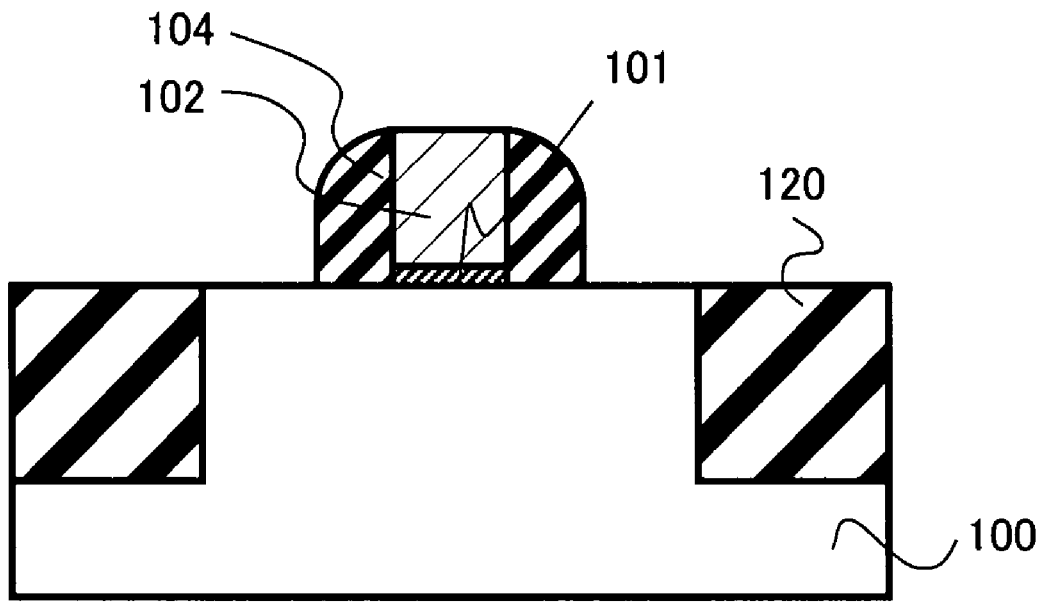
FIGS. 17 to 21 depict, in cross-section, major steps in the manufacture of a semiconductor device of third embodiment of the invention.

After having performed the process steps shown in FIGS. 4-5, deposit by LPCVD a silicon nitride (SiN) film to a thickness of about 8 nm. Then, perform etch-back by RIE techniques, thereby forcing the SiN film to selectively reside on the opposite sidewall faces of poly-Si gate electrode 102 as shown in FIG. 17. Thus the "first" gate sidewall insulator films 104 are formed.

Figure 18:
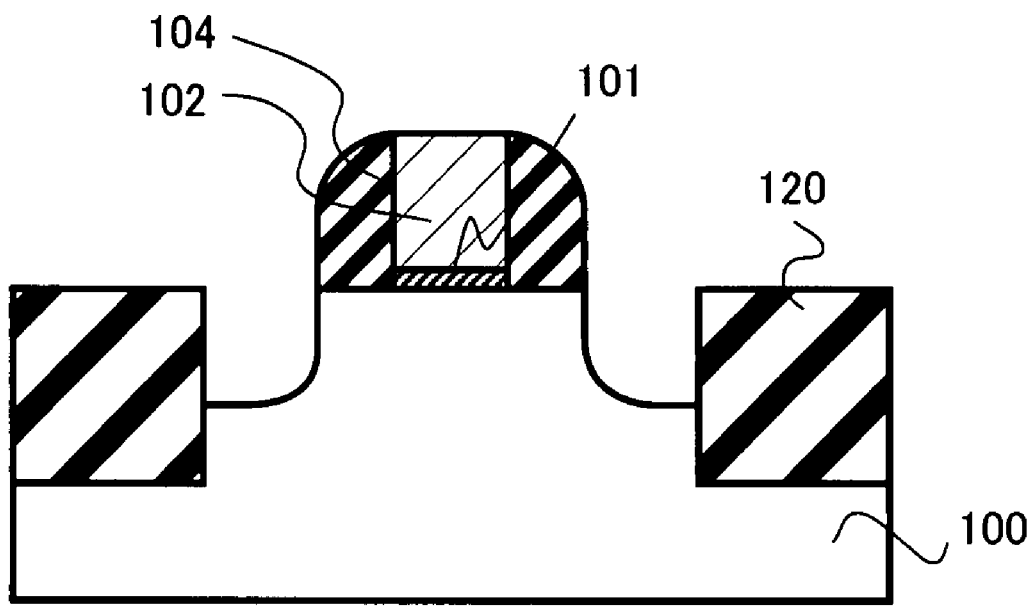

Next, as shown in FIG. 18, with the poly-Si gate electrode 102 and first sidewall insulators 104 as a mask, selectively etch the exposed surface portions of Si substrate 100 to thereby dig it to a depth of about 30 nm. Thus, recess portions corresponding to MISFET S/D regions are defined in the substrate surface in such a manner that these are self-aligned with the sidewall insulator-added poly-Si gate electrode structure as shown in FIG. 18.

Figure 19:
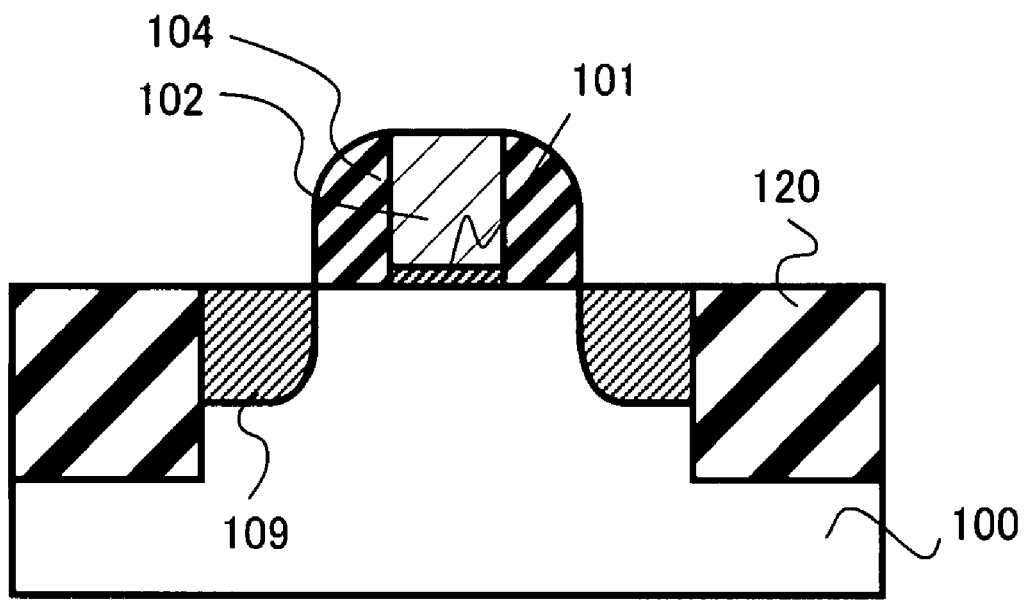

Next as shown in FIG. 19, selective epitaxial growth is performed to fill the recesses in Si substrate 100 with SiGe layers 109 as buried therein. At this time, let SiGe layer 109 contain therein B atoms at a concentration of about $5 \times 10^{20}$ atoms/cm$^3$. Thereafter, remove the first gate sidewall insulator films 104 away from gate electrode 102 by CDE techniques. Then, form "second" gate sidewall insulator films 107 on the opposite sidewalls of gate electrode 102 by known LPCVD and RIE processes. Note that the second gate sidewall insulators 107 are thinner than first sidewall insulators 104.

Figure 20:
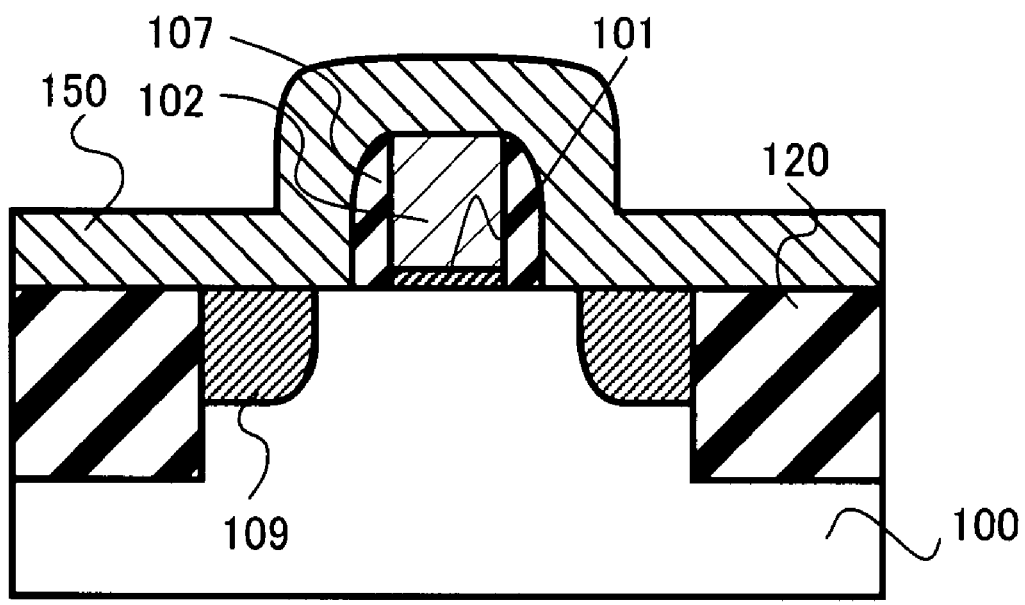

Next as shown in FIG. 20, after having formed by sputtering a 10-nm thick Ni film 150, perform a 400° C., 30 sec anneal, followed by selective removal of film 150 by etching using a chemical solution.

Figure 21:
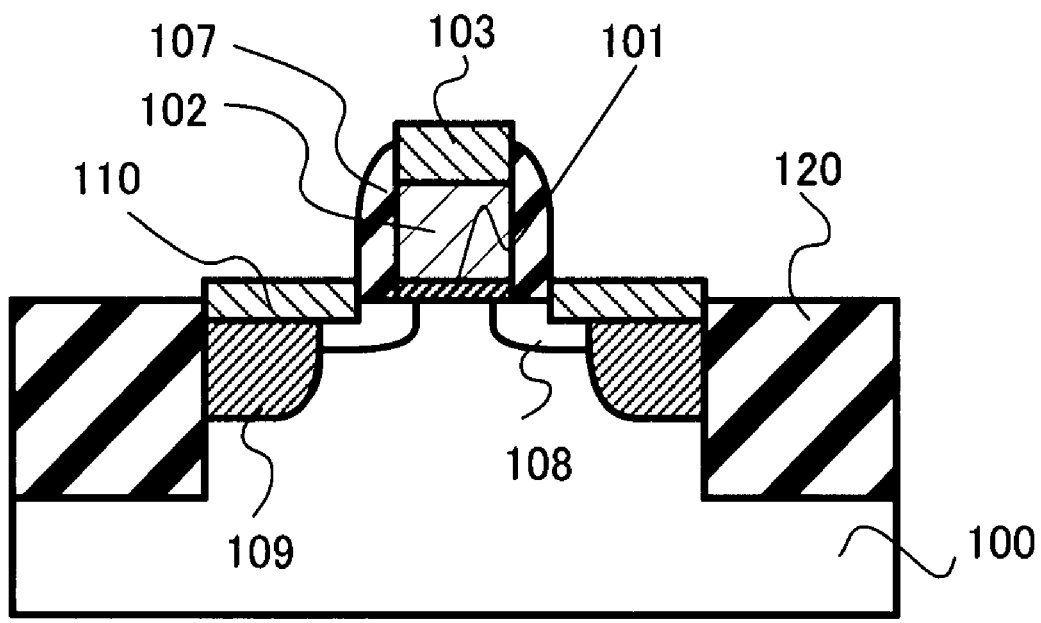

By this process, as shown in FIG. 21, silicidation occurs in the state that Si layer between SiGe layer 109 and poly-Si gate electrode 102 is compressively strained. Thus, NiSiGe films 110 are formed on SiGe layers 109 for use as S/D regions; a NiSi film 103 is on Si gate electrode 102. At this time the B atoms being contained in SiGe layers 109 at high concentration are once absorbed by NiSi/NiSiGe films. However, these B atoms are thereafter swept out toward the Si layer side that becomes more stable energetically. This results in heavily B-doped S/D extension layers 108 being formed around the gate-side edge portions of NiSi layers 110 in Si substrate 100, as shown in FIG. 21.

The MISFET device of FIG. 21 has a P-channel type Schottky transistor structure with a Schottky junction (metal-semiconductor junction) between S/D region and channel region. In prior art P-type Schottky transistor fabrication processes, B atoms doped tend to segregate into NiSi layer, resulting in its interface increasing in electrical resistance, so it was incapable of taking full advantages of short-channel effect-excellent Schottky transistors. In contrast, the embodiment Schottky MISFET shown in FIG. 21 is able to much reduce the resistance of interface, thereby offering the full advantages inherent thereto.

Embodiment 4

A semiconductor device fabrication method in accordance with a further embodiment of the invention is shown in FIGS. 22 to 25. This method is similar to that shown in FIGS. 17-21 with the Si layer-applied compressive strain being replaced by the inherently existing compression available by introduction of carbon (C) into Si layer, rather than the externally applied compression due to SiGe layer.

Figure 22:
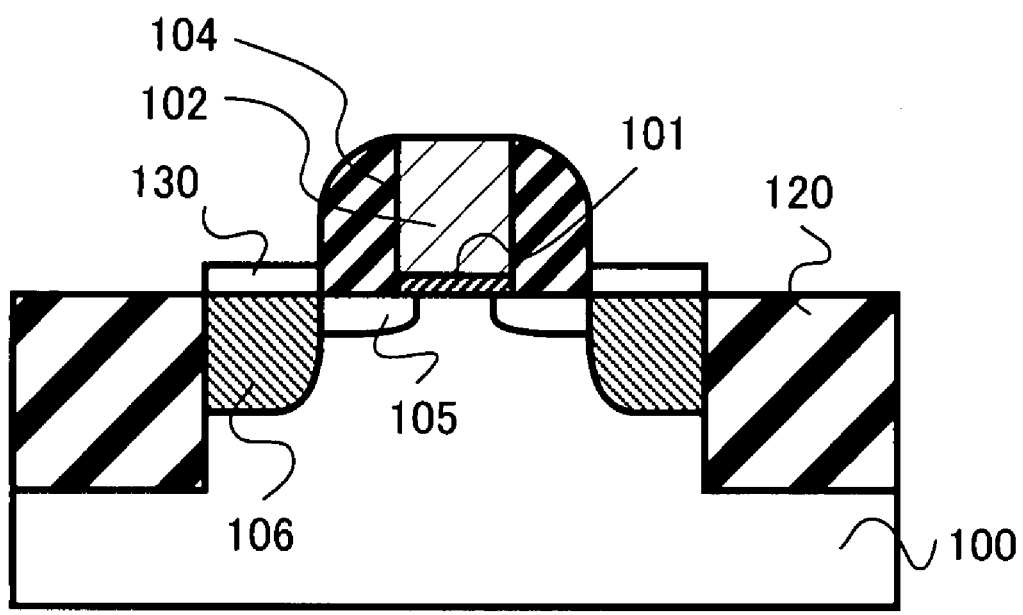
FIGS. 22 to 25 depict in cross-section major steps in the manufacture of a semiconductor device of forth embodiment of the invention.

After having performed the fabrication processes up to the step of FIG. 9, form a pair of Si layers 130 by selective epitaxial growth on the exposed surfaces of S/D regions in Si substrate 100 as shown in FIG. 22.

Figure 23:
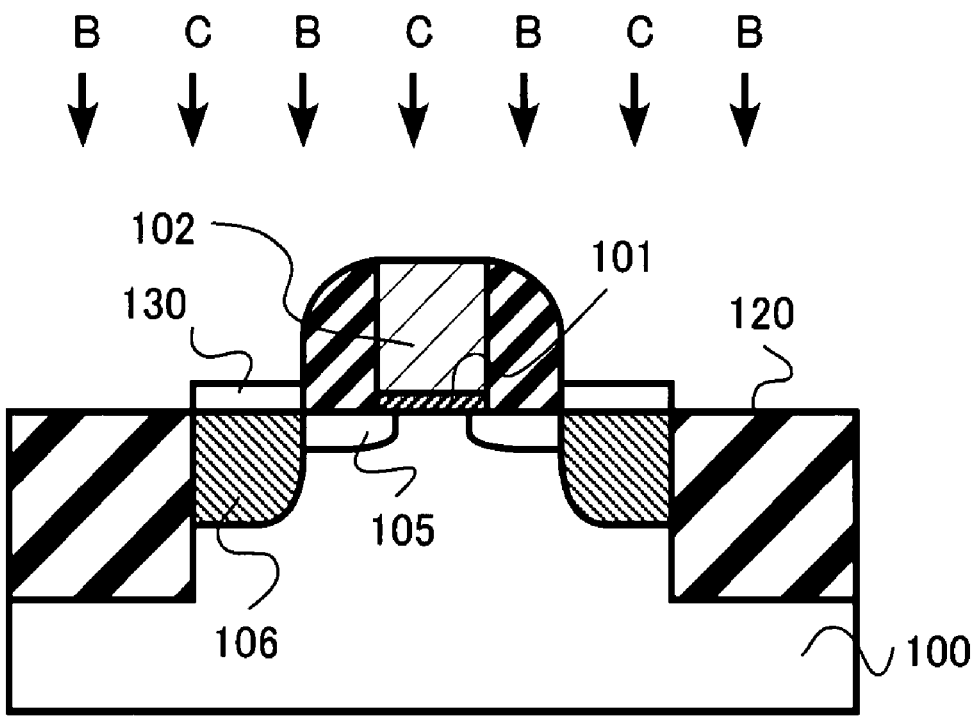

Then, as shown in FIG. 23, implant into Si layers 130 a mixture of carbon (C) and boron (B) ions to a concentration of $5 \times 10^{20}$ atoms/cm$^3$. The C/B mixture's molar ration was set at 1:1.

Figure 24:
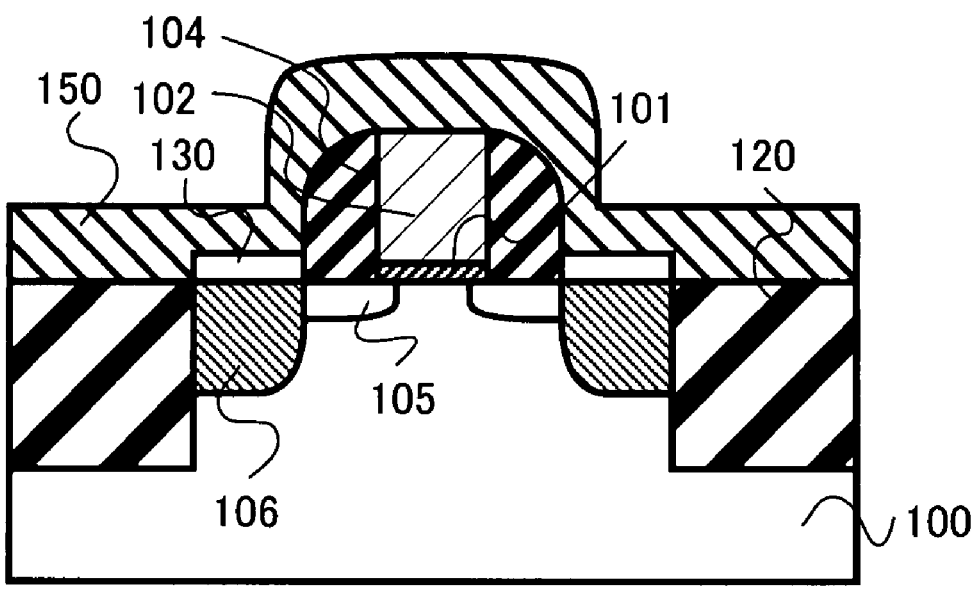
Figure 25:
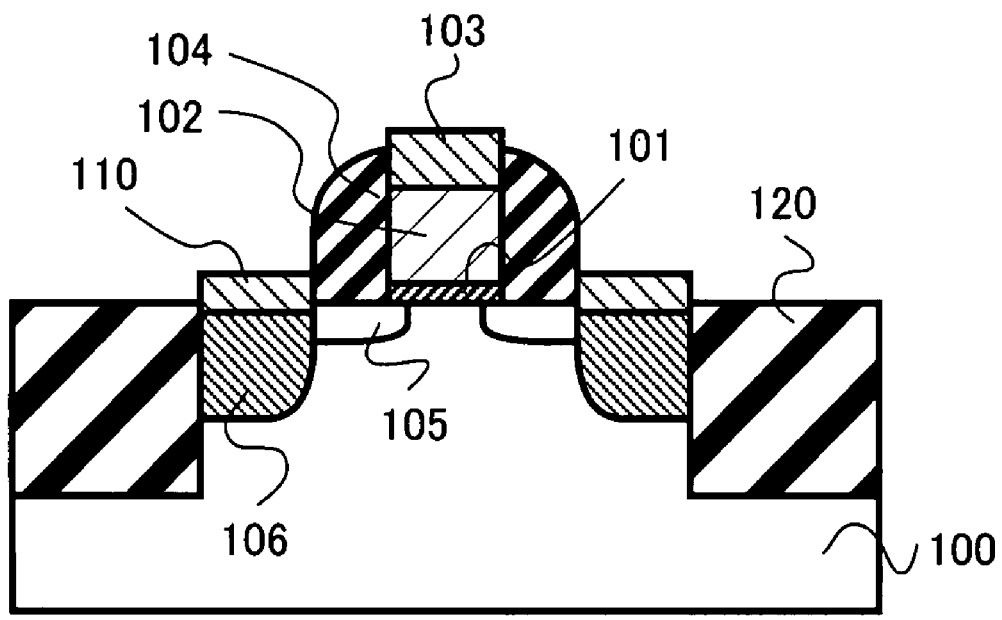

Next, as shown in FIG. 24, form by sputtering a Ni film 150 to a thickness of about 10 nm. Thereafter, apply thereto a 400° C., 30 sec anneal, followed by execution of selective removal of it using a chosen chemical. By the process above, a semiconductor device having a P-channel MISFET (PMISFET) device structure shown in FIG. 25 is fabricated.

As C atoms are smaller than Si atoms, replacing with Si atoms in Si or NiSi layer results in creation of the internally existing compressive distortion or strain in the entire region. Owing to this, performing silicidation using the C/B mixture as the impurity of Si layer results in achievement of the intended silicidation with application of the compressive strain, causing B atoms to be swept out of a silicide film toward either the Si layer side or the SiGe layer side. Thus, in this embodiment also, the NiSi/Si layer interface resistance reduction is attainable.

Although this embodiment is designed to use the buried SiGe layer, similar results concerning the NiSi/Si layer interface resistance reducibility are still obtainable by eliminating the use of such buried layer while at the same time reducing process complexities and production costs.

Embodiment 5

Figure 26:
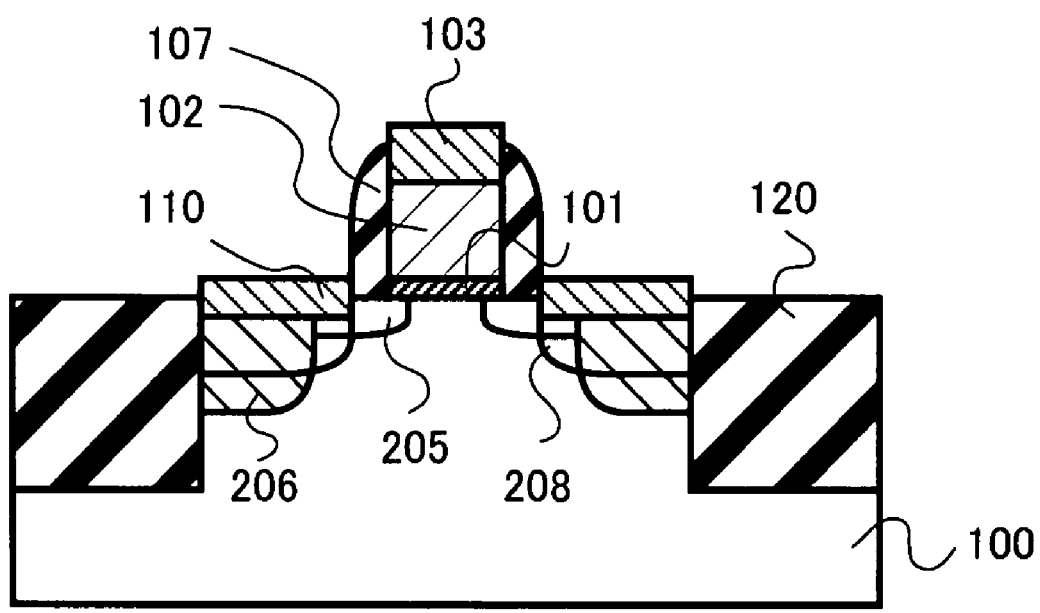
FIGS. 26 and 27 are diagrams showing a sectional view of a semiconductor device of fifth and sixth embodiment of the invention, respectively.

An N-channel MISFET (NMISFET) device in accordance with another further embodiment of this invention is shown in FIG. 26 in sectional diagram form. This NMISFET is fabricated by a method incorporating the principles of the invention—i.e., the strain-applied silicidation. This method is similar to that shown in FIGS. 4-11 with the n-type substrate changed to a p-type substrate, with the B impurity changed to an As impurity, with the SiGe buried layer changed to a SiC layer, and with the compressive strain changed to tensile strain.

In this embodiment fabrication method, silicidation is done while applying tensile strain to the heavily As-doped semiconductive layer. This serves advantageously to further facilitate the segregation of As atoms into Si layer as stated previously in the description of the principles of this invention, thereby reducing the electrical resistance of the NiSi/Si layer interface.

Regarding the NMISFET device structure shown in FIG. 26, this device has a channel region defined in the surface of Si substrate 100, a gate electrode 102 insulatively overlying the channel region with gate insulator film 101 sandwiched therebetween, a pair of $Si_xC_{1-x}$ layer ($0 \leq x < 1$) 206 for use as S/D regions at both sides of the channel, a couple of heavily-doped n (n$^+$) type diffusion layers 208 formed between the channel and SiC layers 206 with As doped therein to an increased concentration of $5 \times 10^{19}$ to $1 \times 10^{21}$ atoms/cm$^3$, and a pair of nickel silicide (NiSi) layers 110 on the surfaces of n$^+$-type diffusions 208, characterized in that the concentration of As impurity in n$^+$-type diffusions 208 is higher than the impurity concentration of NiSi layers 110.

With the presence of a low-resistance NiSi/Si layer interface between the channel region and each SiC S/D region 206, the transistor characteristics are improved as in the first embodiment.

Embodiment 6

Figure 27:
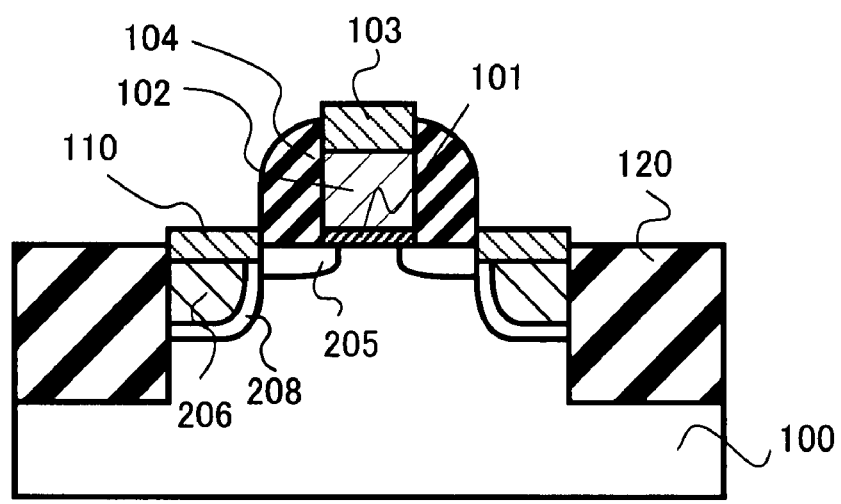

An NMISFET device structure also embodying the invention is shown in FIG. 27. This embodiment device is with As atoms as an impurity dopant thereof and is fabricated by a process which is similar to that of the second embodiment shown in FIGS. 13-16, with the n-type substrate being changed to a p-type substrate, with the B impurity changed to As, with the SiGe buried layer changed to a SiC layer, and with the compressive strain changed to a tensile strain. The fabrication process of this embodiment is also similar to that of the fifth embodiment with the heavily As-doped S/D diffusion layers 208 being modified to be formed by epitaxial growth rather than the ion implantation.

In the semiconductor device fabrication method of this embodiment, silicidation is done while at the same time applying a tensile strain to the heavily As-doped S/D diffusion layers. Thus, as in the fifth embodiment, the segregation of As atoms in Si layer is appreciably facilitated to thereby reduce the NiSi/Si layer interface resistance. Additionally an advantage of this embodiment over the fifth embodiment lies in its ability to simplify the fabrication process.

As for the NMISFET device structure shown in FIG. 27, this device has a channel region defined in the surface of Si substrate 100, a gate electrode 102 insulatively overlying the channel region with gate insulator film 101 sandwiched therebetween, a pair of $Si_xC_{1-x}$ layer ($0 \leq x < 1$) 206 for use as S/D regions at both sides of the channel, a couple of heavily-doped n (n$^+$) type diffusion layers 208 formed between the channel and SiC layers 206 with As doped therein to an increased concentration of $5 \times 10^{19}$ to $1 \times 10^{21}$ atoms/cm$^3$, and a pair of nickel silicide (NiSi) layers 110 on the surfaces of n$^+$-type diffusions 208, characterized in that the concentration of As impurity in n$^+$-type diffusions 208 is higher than the impurity concentration of NiSi layers 110.

As this embodiment device is similar in structure to the fifth embodiment device, it offers effects and advantages as to the improvement of transistor characteristics in a similar way to the fifth embodiment.

Embodiment 7

Figure 41:
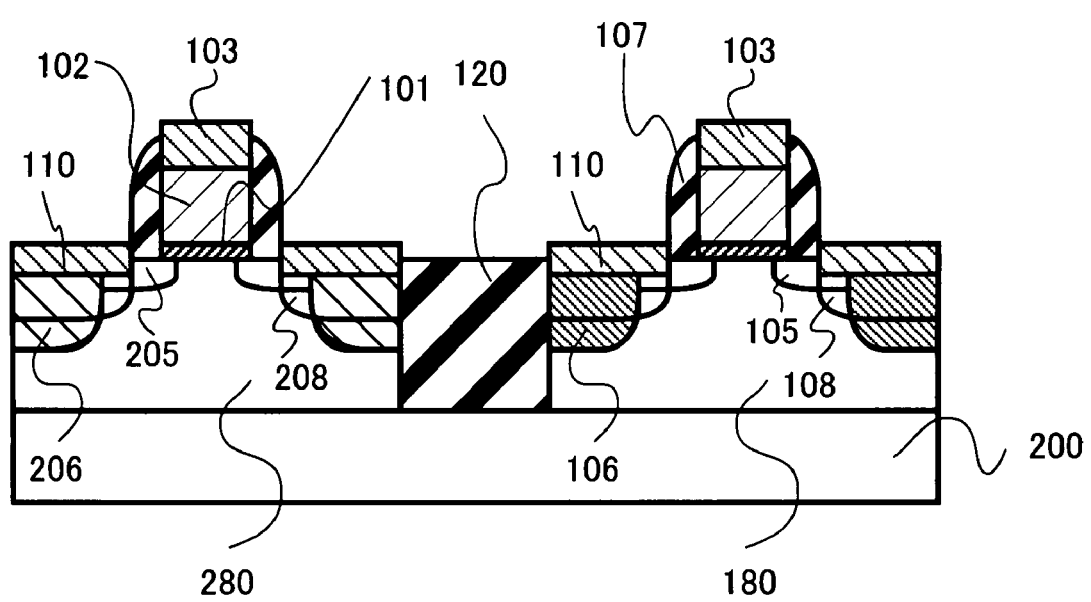
FIG. 41 is a sectional view of the semiconductor device of seventh embodiment of the invention.

A complementary MISFET (CMISFET) device also embodying the invention is shown in FIG. 41, which has in combination the PMISFET of FIG. 1 and the NMISFET shown in FIG. 26, which are integrated together on a p-type Si substrate 200.

The CMISFET device of FIG. 41 offers the advantages obtainable by the MISFETs of the first and fifth embodiments and thus is capable of reducing the NiSi/Si layer interface resistance for both the PMISFET and the NMISFET at a time, thereby enabling achievement of enhanced speed performances of CMISFET—typically, a CMOSFET.

Figure 28:
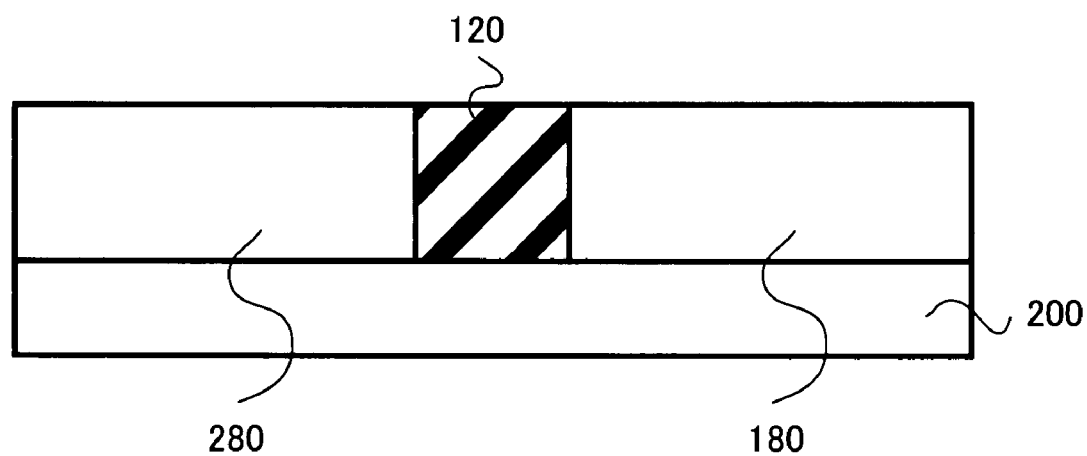
FIGS. 28 through 40 illustrate in cross-section major steps in the fabrication of a semiconductor device of seventh embodiment of the invention.

A fabrication method of the CMISFET device will be described with reference to FIGS. 28-41 below. First, as shown in FIG. 28, prepare a silicon (Si) substrate 200, which has a top surface of a (100) crystal plane with boron (B) doped thereinto to a concentration of about $10^{15}$ atoms/cm$^3$. Then, form in the substrate surface a shallow trench isolation (STI) region 120 made of a SiO$_x$ film for electrical separation of on-chip circuit elements. Next, form by ion implantation an n-type semiconductor well region 180 and a p-type well region 280 in the substrate surface so that these are laterally adjacent to each other with STI isolator 120 interposed therebetween. Then, form a gate insulator film 101 to an equivalent oxide thickness (EOT) of 1 nm, or more or less, followed by low-pressure chemical vapor deposition (LPCVD) of a poly-Si film for later use as gate electrodes 102 to a thickness of about 100 to 150 nm.

Figure 29:
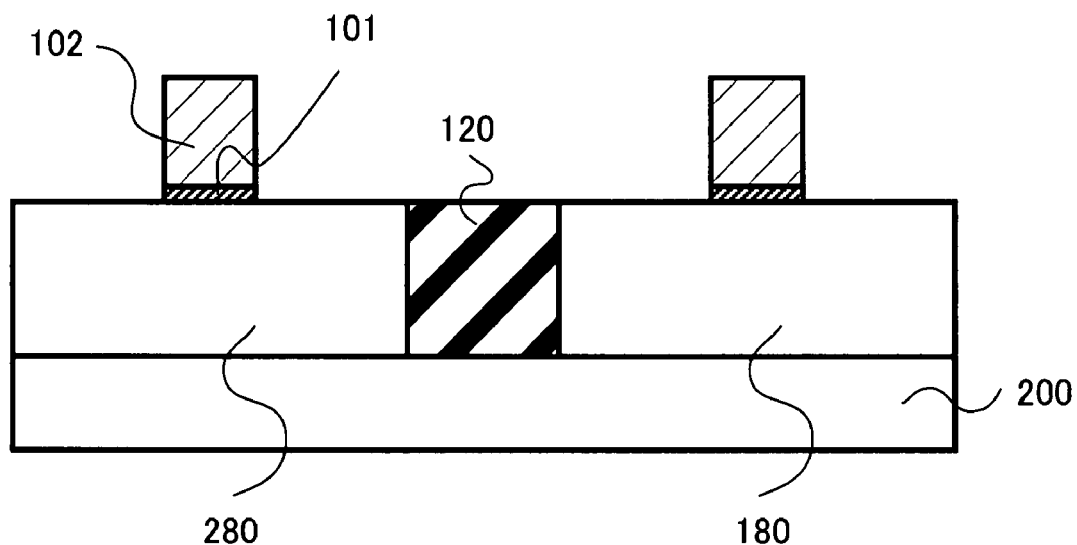

Next, as shown in FIG. 29, pattern the ploy-Si film by lithography and RIE processes to thereby form gate electrodes 102 above the surface of n-well 180 and p-well 280, respectively. These gate electrodes 102 are electrically insulated from n- and p-wells 180 and 280 by the patterned gate insulator film 101. Each gate electrode 102 is about 30 nm in its gate length. If required, perform post-oxidation of 1-2 nm.

Figure 30:
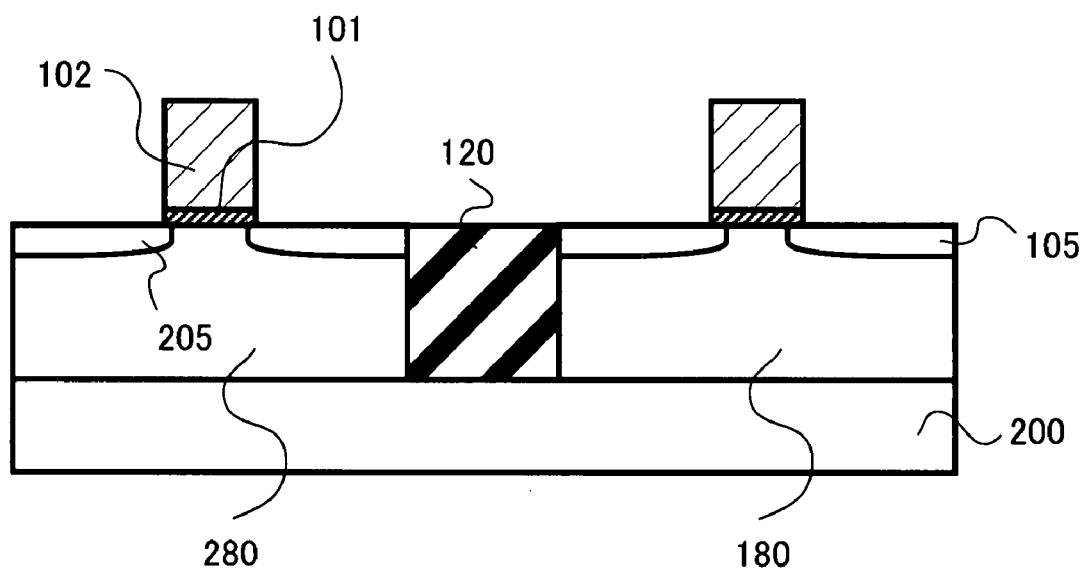

Next as shown in FIG. 30, form in the n-well 180 a pair of p-type S/D extension diffusion regions 105 doped with a B impurity to a concentration of about $10^{20}$ atoms/cm³ while forming in the p-well 280 a pair of p-type S/D extension diffusion regions 205 doped with an As impurity to the concentration of about $10^{20}$ atoms/cm³. Typically these layers 105 and 205 are formed by known ion implantation techniques for doping the B or As impurity using different resist mask patterns. Then, apply thereto annealing for activation, such as the so-called spike anneal at a temperature of about 1050° C.

Figure 31:
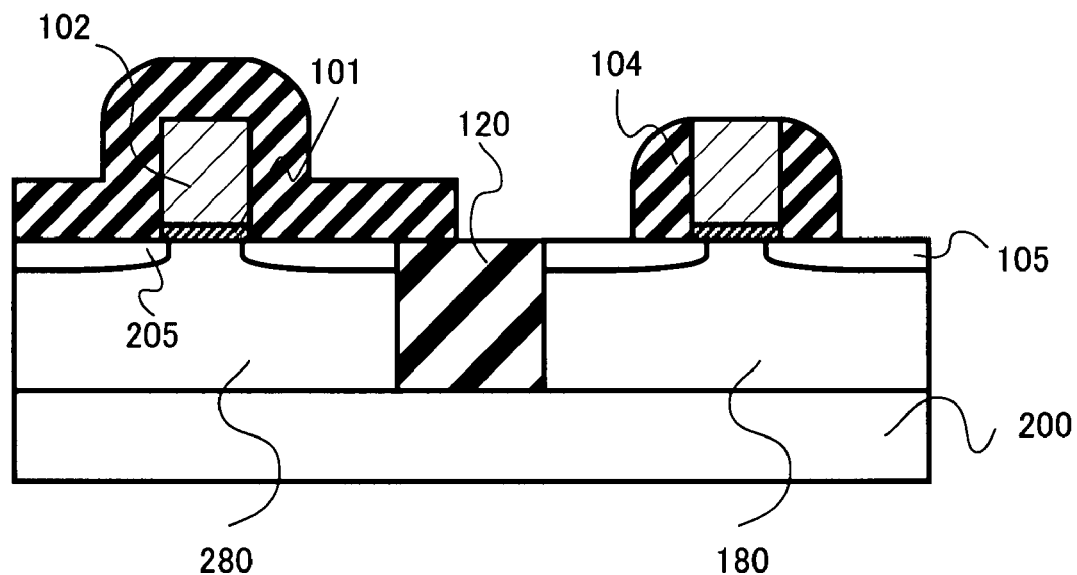

Next as shown in FIG. 31, after having deposited by LPCVD a SiN film to a thickness of about 8 nm, perform RIE-based etchback in the state that the p-well 280 is covered with a resist mask (not shown), thereby to form gate sidewall insulator films 104 on the opposite side faces of insulated gate electrode 102 on n-well 180.

Figure 32:
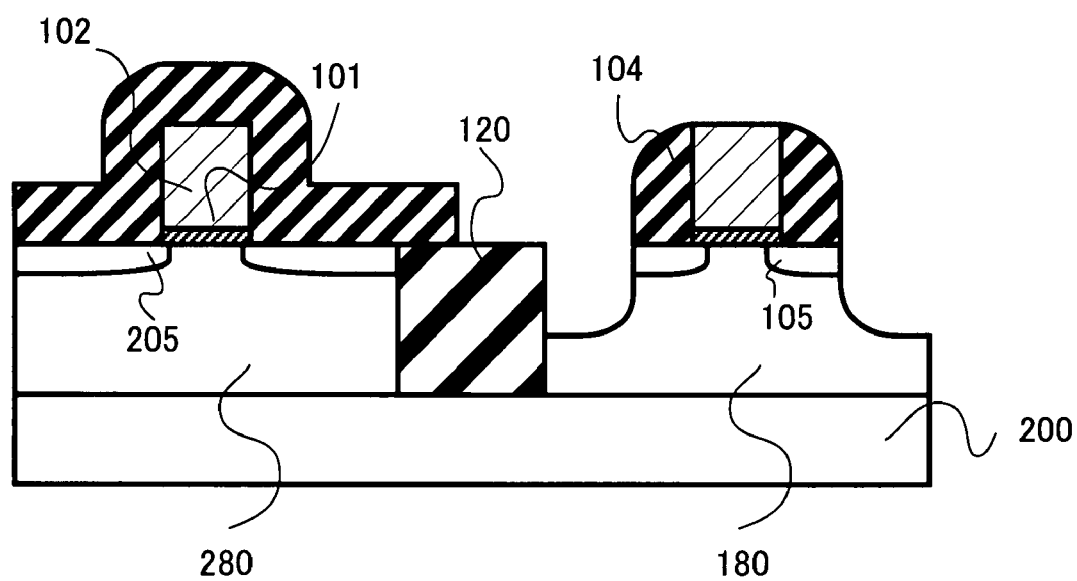

Subsequently as shown in FIG. 32, with the n-well gate electrode 102 and gate sidewall insulator films 104 as a mask, etch the p-type extension diffusions 105 and Si substrate 200 to define recess portions with a depth of about 30 nm from the substrate surface. These recesses are self-aligned with the sidewall insulator-added gate electrode structure.

Figure 33:
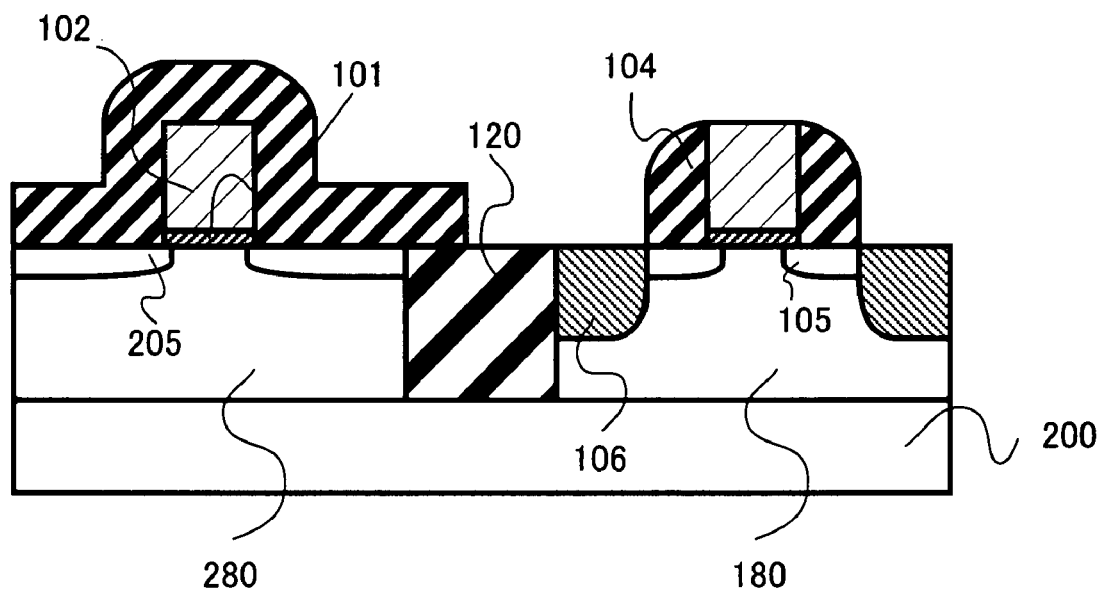

Next, after having removed the resist mask, form a SiGe layer 106 to fully fill the recesses in n-well 180 by selective epitaxial growth techniques as shown in FIG. 33. These recess-filling or "buried" layers 106 are epitaxially grown from the Si crystal layer on the substrate side.

Figure 34:
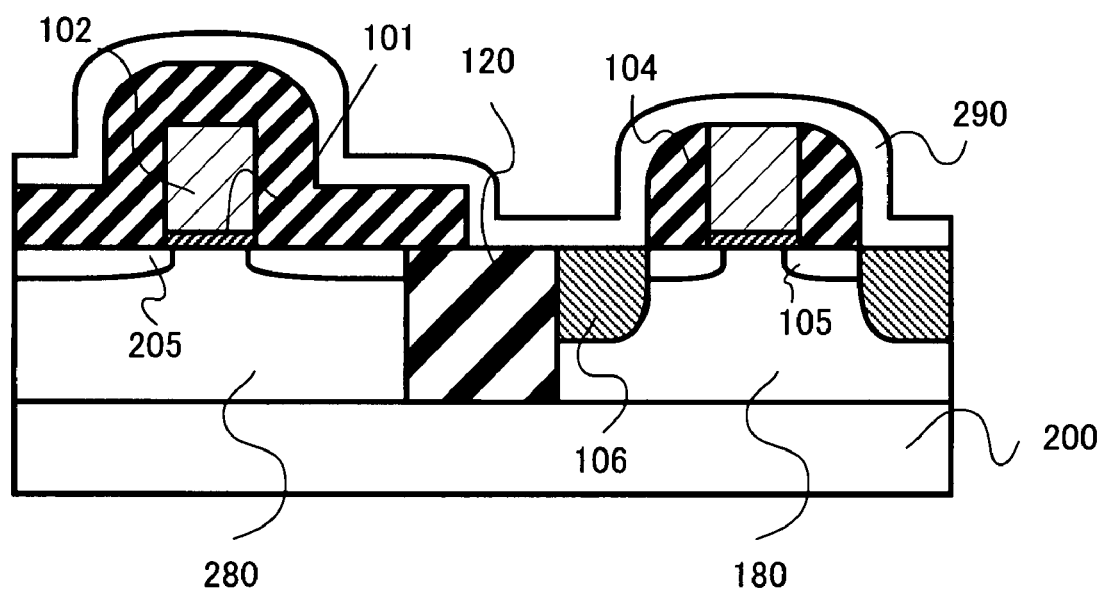

Next as shown in FIG. 34, form by LPCVD a silicon oxide ($SiO_x$) film 290 of about 20 nm thick on the entire surface of the resultant device structure.

Figure 35:
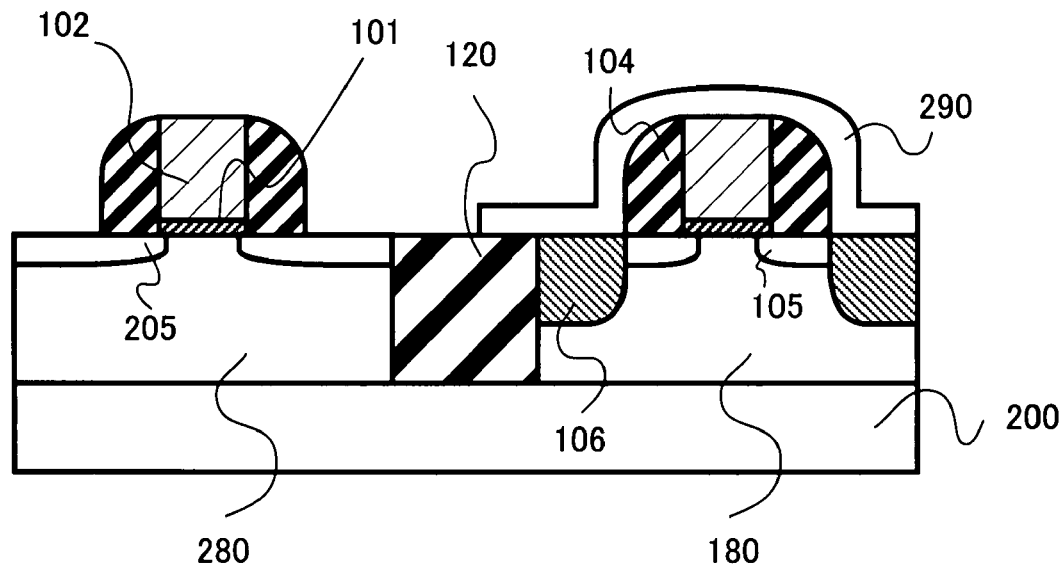

Next as shown in FIG. 35, perform RIE etchback while covering the n-well 180 with a patterned resist mask (not shown) to thereby form sidewall insulator films 104 on the both side faces of the insulated poly-Si gate electrode 102 on p-well 280.

Figure 36:
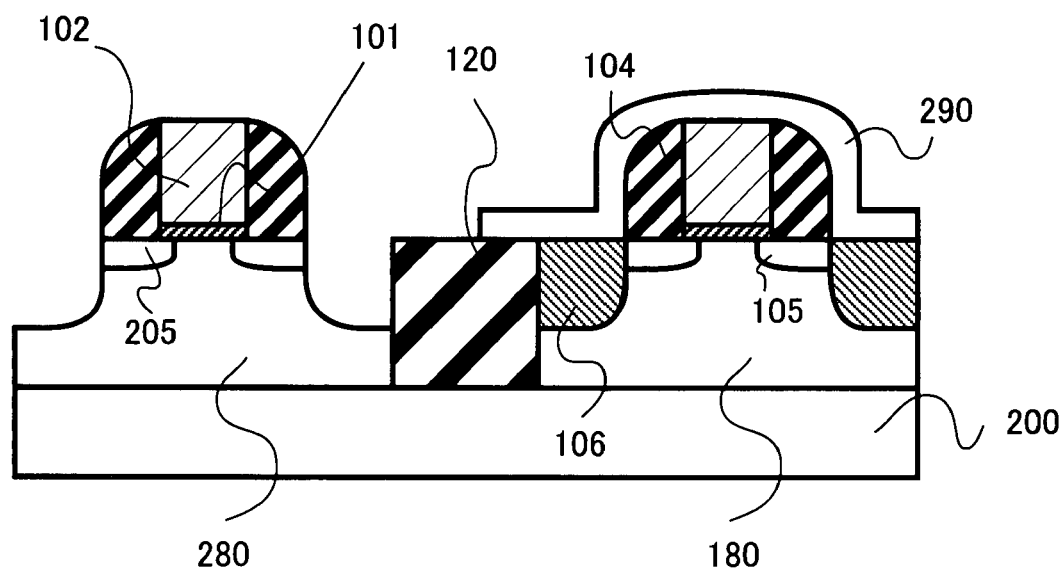

Subsequently as shown in FIG. 36, with the p-well gate electrode 102 and its sidewall insulator films 104 as a mask, etch the n-type extension diffusions 205 and Si substrate 200 to a depth of about 30 nm, thus forming recesses in the substrate surface as self-aligned with the sidewall insulator-added gate electrode structure.

Figure 37:
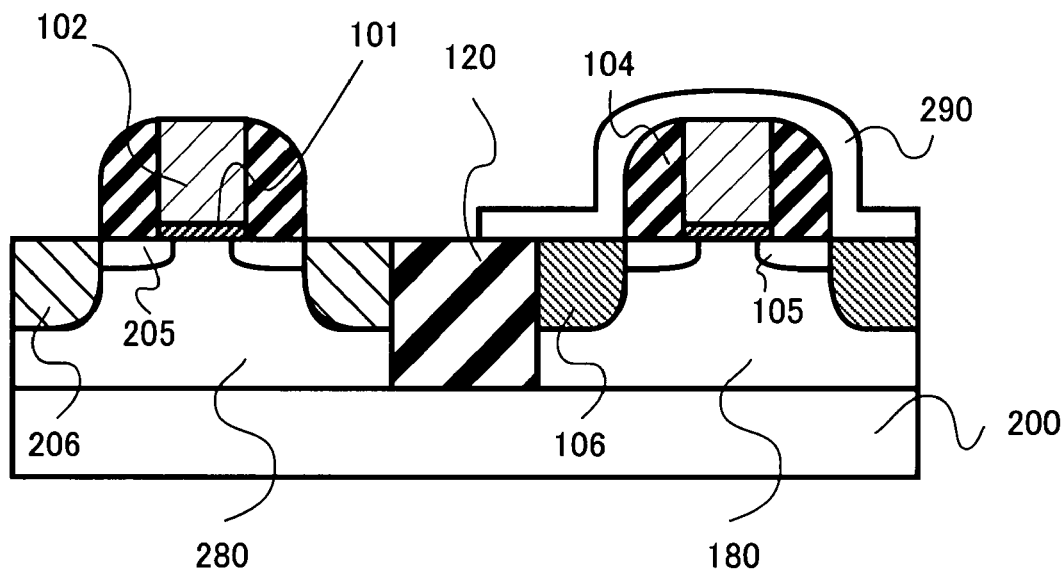

Next, after having removed the resist mask, form by selective epitaxial growth a SiC layer 206 to fill the etched recesses in p-well 280 as shown in FIG. 37. The resulting SiC buried layers 206 are epitaxially grown from the Si crystal layer on the substrate side. After having formed the epitaxial growth layers 206, remove by CDE the "first" gate sidewall insulator films 104 being presently formed on both sidefaces of p-well gate electrode 102. Thereafter, form by LPCVD and RIE a "second" gate sidewall insulator films 107 on the both sidefaces of the same gate electrode 102. This newly formed gate sidewall insulator films 107 are thinner than the previously formed sidewall insulator films 104.

Figure 38:
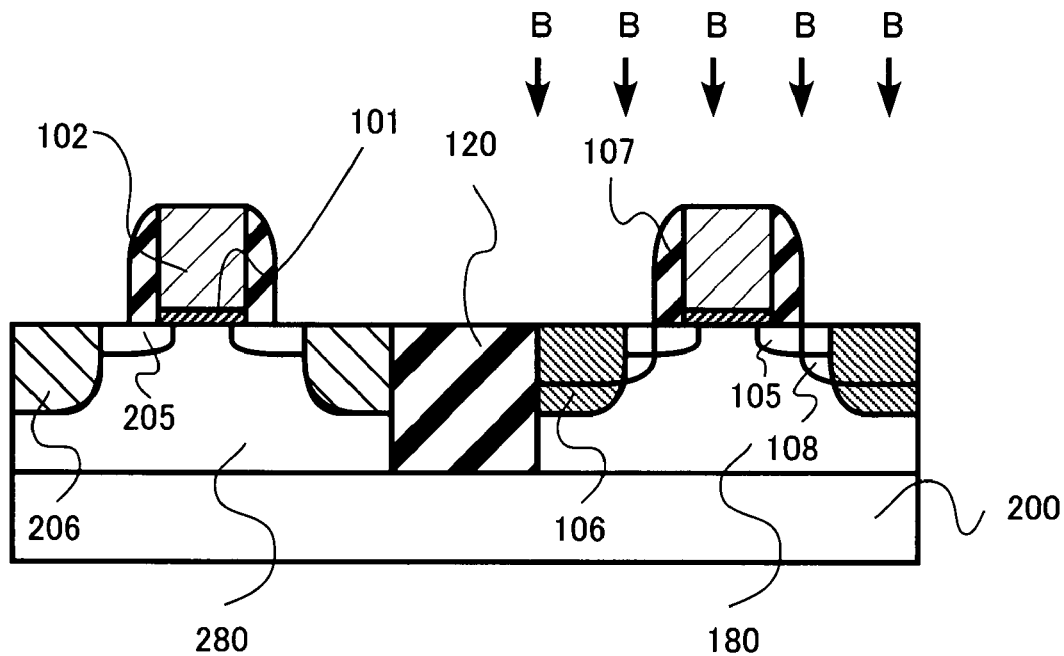

Next as shown in FIG. 38, while covering the p-well 280 with a resist mask (not shown), form a heavily B-doped layers 108 in the n-well 180 by ion implantation with the n-well gate electrode 102 and its sidewall insulator films 107 as a mask.

Figure 39:
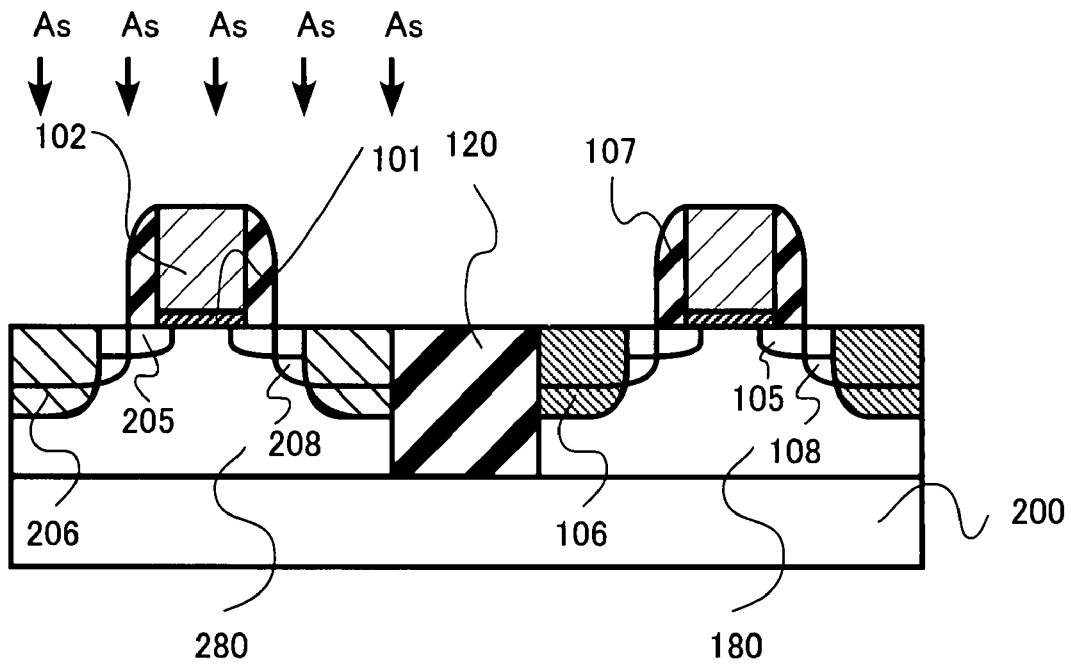

Next as shown in FIG. 39, in the state that the n-well 180 is covered with a resist mask (not shown), form a heavily As-doped layers 208 in the p-well 280 by ion implantation with the p-well gate electrode 102 and the "second" sidewall insulator films 107 as a mask. During this process, the heavily B-doped layers 108 is applied compressive strain whereas the heavily As-doped layers 208 is applied tensile strain.

Figure 40:
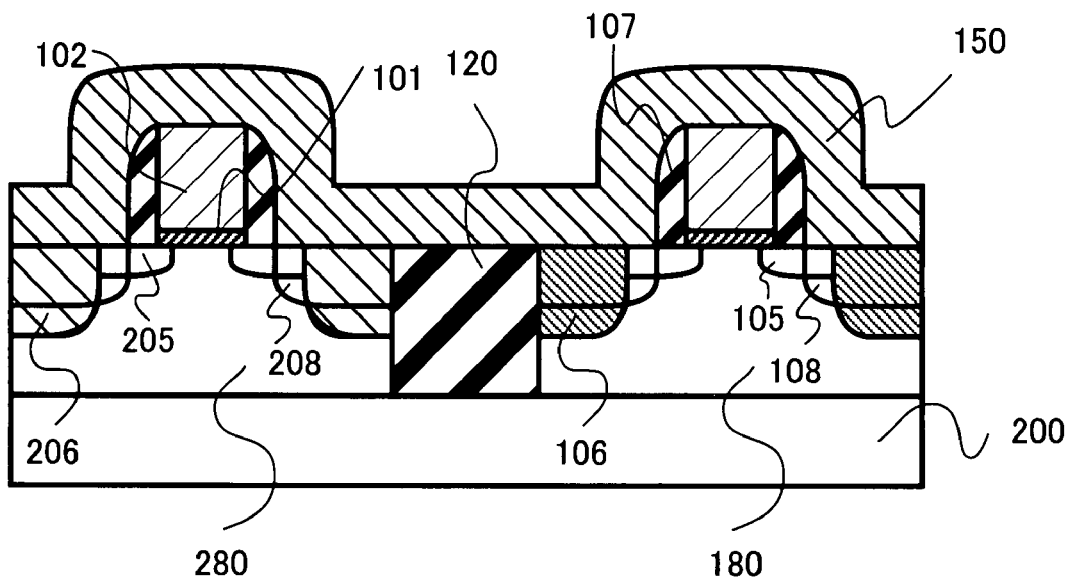

Next as shown in FIG. 40, form by sputtering a 10 nm thick Ni film 150 on the entire surface. Then, perform annealing at 400° C. for 90 seconds and selective removal using a chemical to thereby cause the Ni film 150 and heavily-doped layer 108 plus SiGe layers 106 to react together for silicidation while at the same time letting Ni film 150 and heavily-doped layer 208 plus SiC layer 206 react for silicidation as shown in FIG. 41. Simultaneously, silicidize the poly-Si gate electrodes 102, thereby forming gate suicides 103 thereon in a self-aligned manner as shown in FIG. 41.

With the embodiment process, it is possible to readily fabricate the intended CMISFET or CMOSFET device with its speed performance being enhanced owing to decreases in electrical resistance of silicide/Si layer interfaces.

Embodiment 8

An FET of the type having a fin channel (Fin-FET) also embodying the invention is shown in FIGS. 42 to 46. This Fin-FET is one of multi-gate transistors which has its channel resembling a vertically upstanding plate that extends from a substrate. As this channel is like a fin, this transistor is called the Fin-FET. In general, the Fin-FET offers increased gate controllability, so it is possible to suppress barrier reduction at source end as induced by a drain electric field, also known as drain-induced barrier lowering. This feature permits Fin-FET to have enhanced robustness against short channel effects.

Figure 42:
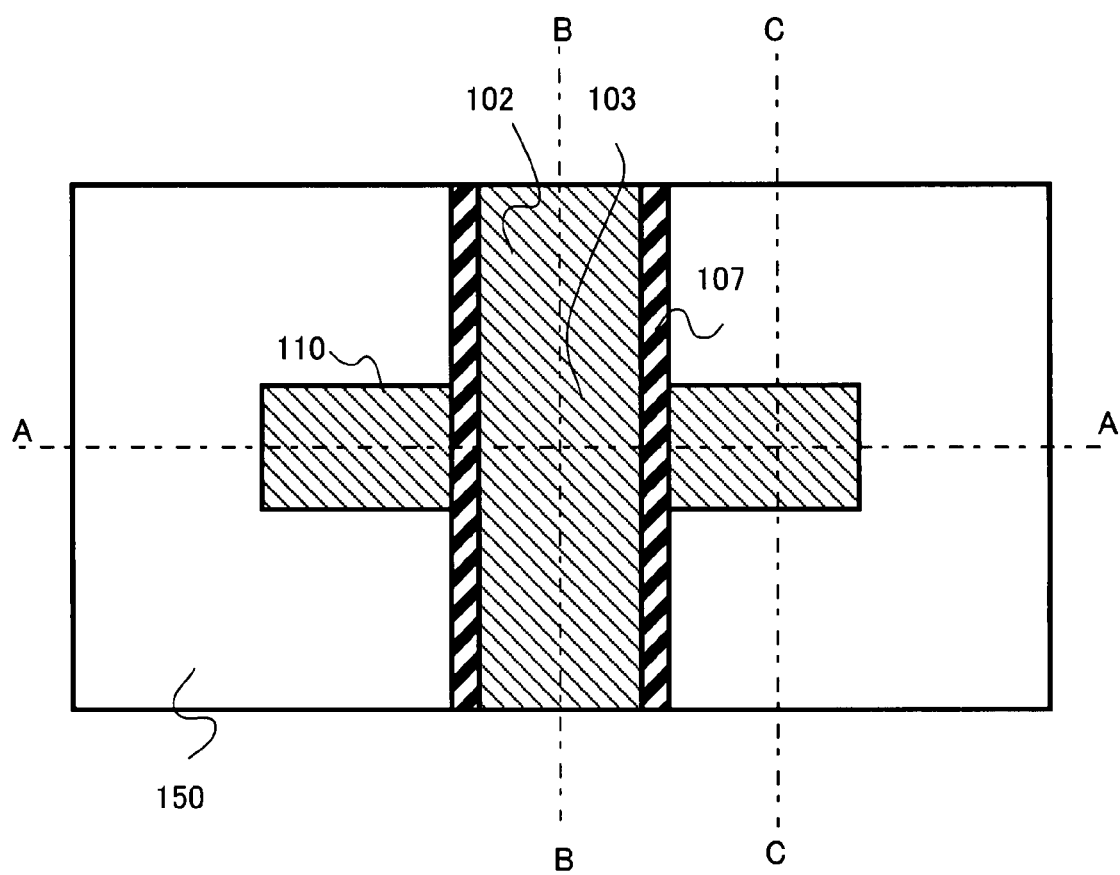
FIGS. 42 to 46 are diagrams showing, in cross-section or in plan view diagram form, a semiconductor device of eighth embodiment of the invention.
Figure 43:
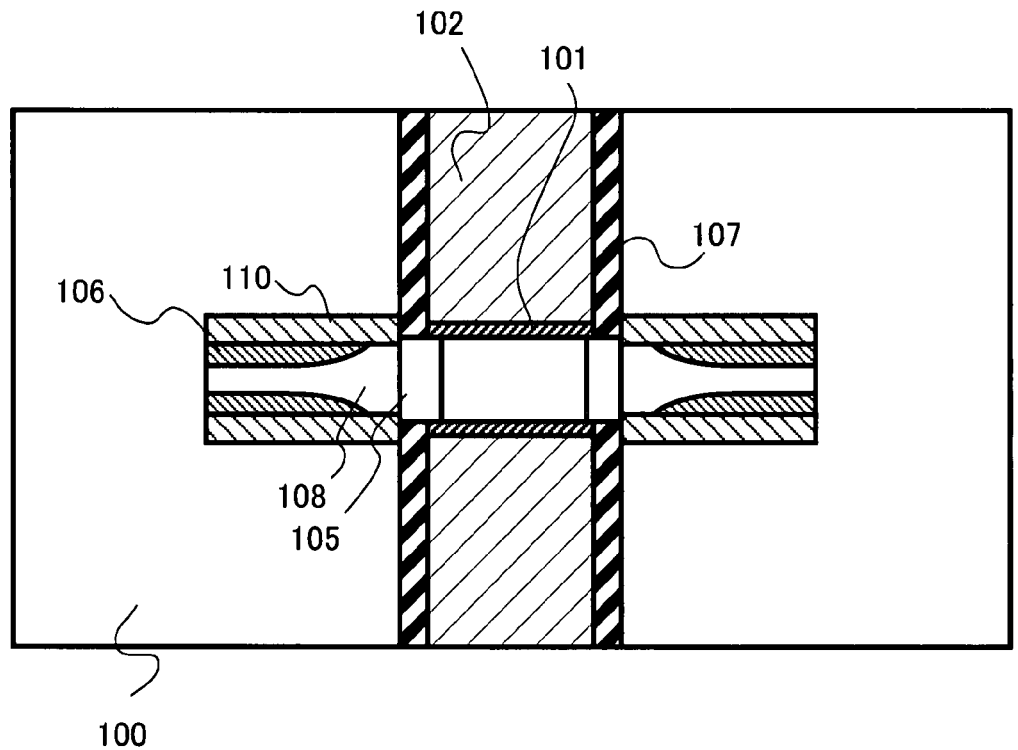
Figure 44:
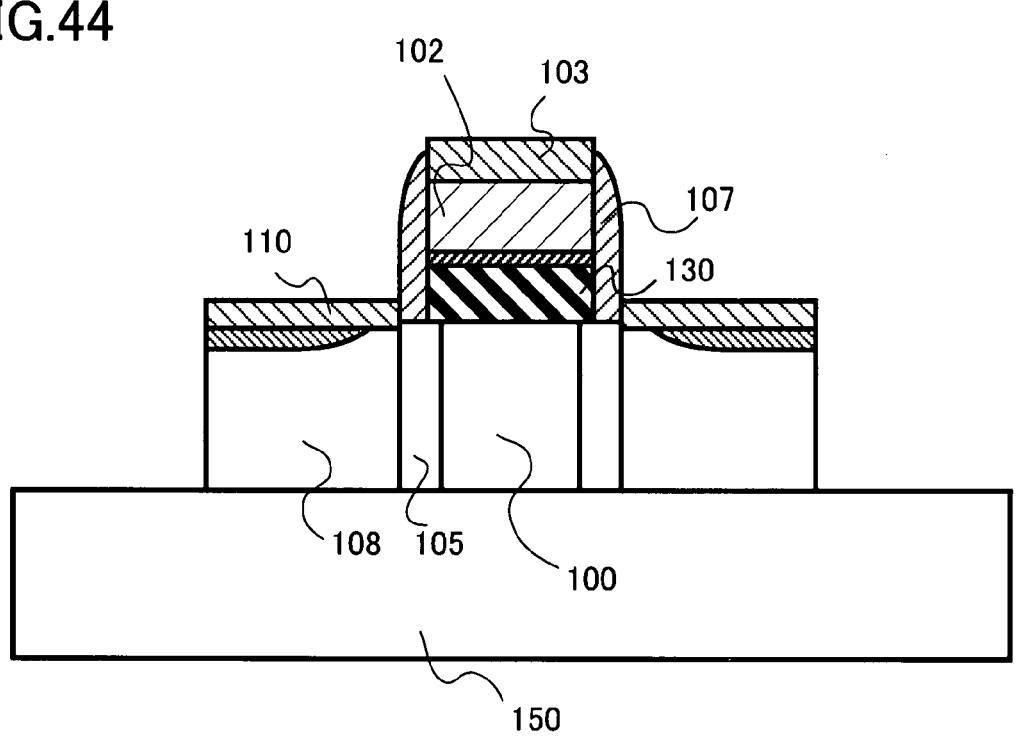
Figure 45:
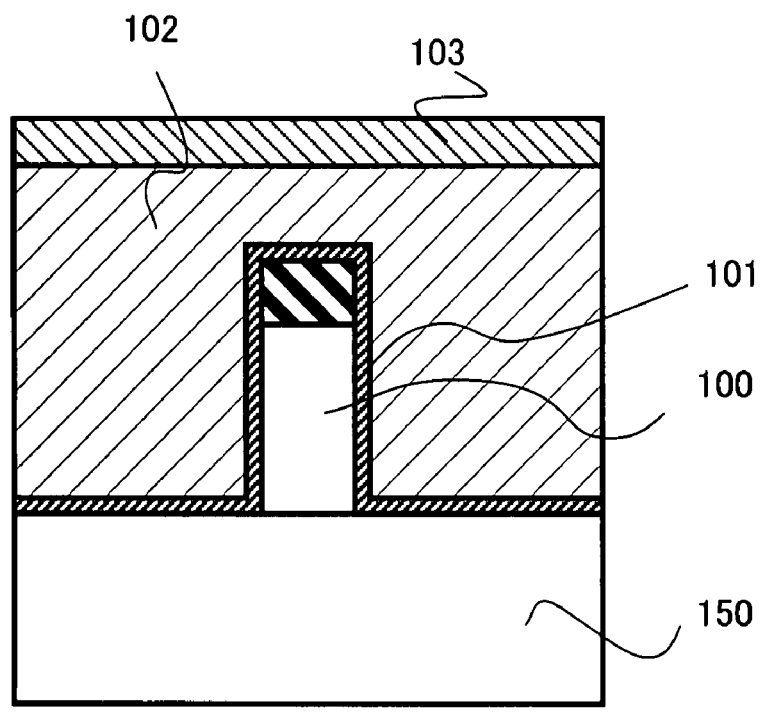
Figure 46:
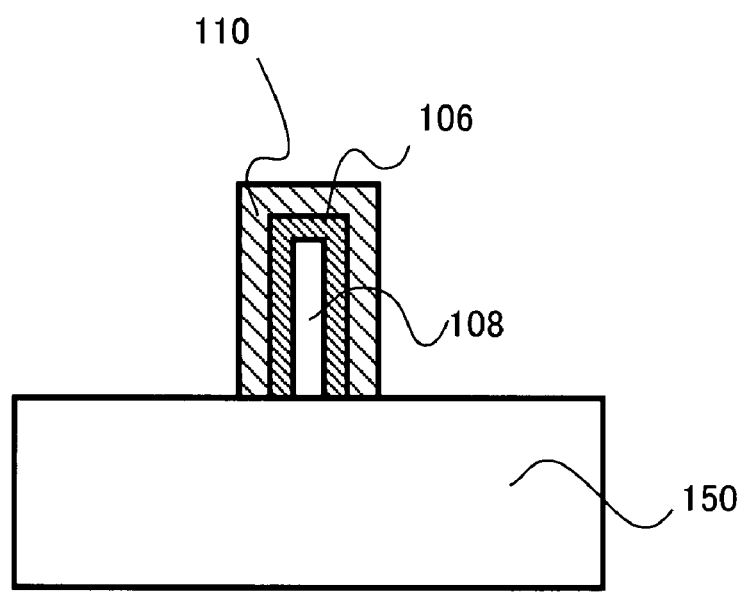
Figure 47:
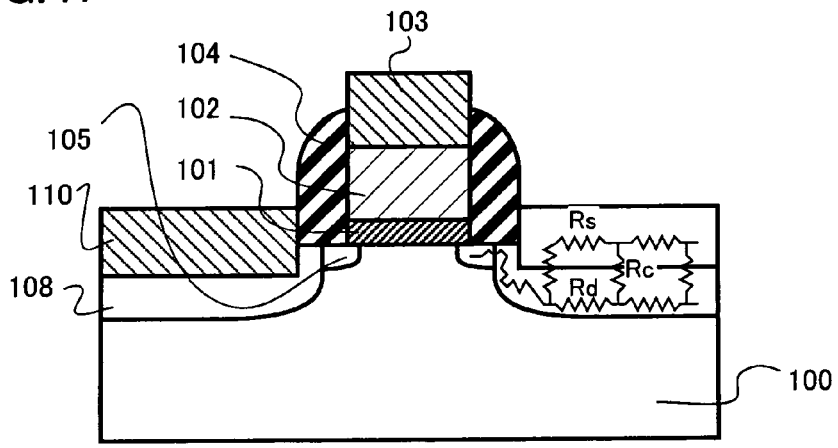
FIG. 47 is a sectional view of one typical prior known MISFET structure.
Figure 48:
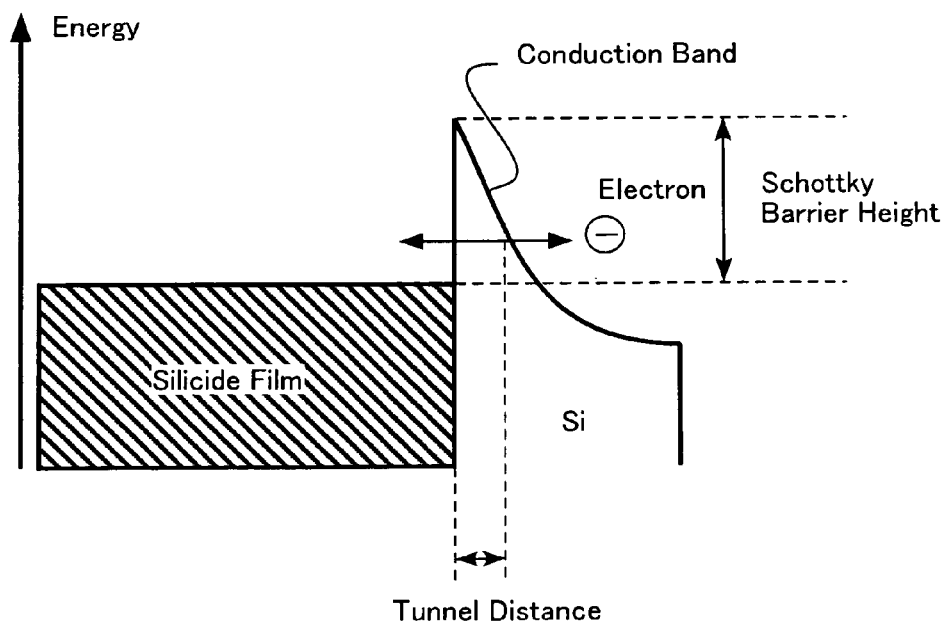
FIG. 48 is an energy band diagram of a Schottky junction to be formed between a NiSi film and a heavily-doped region (Si film).

An upper plan view of the Fin-FET is shown in FIG. 42. A planar sectional view of it is shown in FIG. 43, which is taken along a plane parallel to the substrate surface at a level including a channel region. FIG. 44 is a sectional view of Fin-FET as taken along line A-A of FIG. 42. FIGS. 45-46 are sectional views along lines B-B and C-C of FIG. 42, respectively.

As shown in FIG. 44, the Fin-FET is formed in a silicon-on-insulator (SOI) layer 100 on a buried insulative film layer 150. The channel region is formed in SOI layer 100. This SOI layer has its opposite side faces on which extension diffusion layers 105 are formed. Heavily boron (B) impurity-doped layers 108 are laterally spaced apart from each other on buried insulator layer 150 so that extension layer-added SOI layer 100 is midway between them.

As shown in FIG. 45, the SOI layer 100 serving as the channel region has a pair of opposing principal crystal planes, i.e., channel faces. On these channel faces, a gate electrode 102 is insulatively formed with a gate insulator film 101 interposed therebetween.

As can be seen from FIGS. 43-44, Fin-FET has SiGe layers 106 at opposite surfaces of the channel region. As better shown in FIG. 43, the individual heavily B-doped layer 108 resides in a region at least between poly-Si gate electrode 102 and SiGe layer 106. A nickel silicide (NiSi) layer 110 is formed on layer 108. As shown in FIG. 45, the gate electrode 102 has its top surface covered with a gate silicide film 103 as formed thereon.

Very importantly, the embodiment Fin-FET is arranged so that the heavily-doped layers 108 are higher in concentration of B impurity than NiSi layer 110 in a similar manner to the planar transistors of the first and second embodiments stated supra. Owing to this feature, Fin-FET offers the NiSi/Si layer interface resistance reducibility and thus has improved transistor characteristics in addition to Fin-FET's inherent advantages, such as increased robustness against short channel effects.

Note that the illustrative Fin-FET is fabricatable by the above-stated process shown in FIGS. 4-11 in combination with known Fin-FET fabrication process. Such fabrication method also is included within the coverage of this invention.

Although the illustrative Fin-FET is designed to have p-type conductivity, the principles of this invention may also be applicable to n-type Fin-FETs as in the fifth and sixth embodiments shown in FIGS. 26-27.

While the invention has been described with reference to specific embodiments, the description is illustrative of the invention and is not to be construed as limiting the invention. The Si substrate as used in the embodiments may be modified to employ other similar suitable semiconductive materials, including but not limited to silicon germanium (SiGe), germanium (Ge), silicon carbide (SiC), gallium arsenide (GaAs) and aluminum nitride (AlN).

The crystal plane of substrate material is not exclusively limited to the (100) plane and may alternatively be set to a (110) plane or a (111) plane or else. The principles of this invention are applicable to a wide variety of MISFETs of the type having three dimensional (3D) structures, including Fin structures and double-gate structures. Various modifications and applications may occur to those skilled in the art without departing from the true spirit and scope of the invention.

Lastly, all possible semiconductor devices and fabrication methods which comprise the subject matter of this invention and which are design-modifiable by those skilled in the art along with semiconductor devices prepared thereby should be interpreted to be included in the coverage of the invention. The invention is, therefore, to be limited only as indicated by the scope of the appended claims, with equivalents thereof being included therein.

What is claimed is:

1. A method of making a semiconductor device comprising:
    forming a gate insulating film above a semiconductive substrate;
    forming a gate electrode on the gate insulating film;
    forming in or on the substrate at both sides of the gate electrode a pair of spaced-apart heavily-doped impurity layers of p-type conductivity to a concentration ranging from $5\times10^{19}$ to $1\times10^{21}$ atoms per cubic centimeter (/cm$^3$);
    forming a silicide layer by causing the impurity layers to react with a metal while simultaneously applying a compressive strain to the impurity layers; and
    forming a $Si_xGe_{1-x}$ (where x is greater than or equal to zero and less than one) layer in or on the substrate at the both sides of the gate electrode,
    wherein the impurity layers are formed at least in a region between the gate electrode and the $Si_xGe_{1-x}$ layer.

2. The method of claim 1, further comprising
    forming a first sidewall insulator film on both side faces of the gate electrode,
    etching the substrate with the gate electrode and the first sidewall insulator film being as a mask,
    removing the first sidewall insulator film, and
    forming on the both faces of the gate electrode a second sidewall insulator film less in thickness than the first sidewall insulator film after having removed the first sidewall insulator film,
    wherein the $Si_xGe_{1-x}$ layer is formed after etching the substrate and yet prior to removal of the first sidewall insulator film and
    wherein the impurity layers are formed by doping an impurity by ion implantation with the gate electrode and the second sidewall insulator film as a mask.

3. The method of claim 1, further comprising
    forming a sidewall insulator film on both side faces of the gate electrode, and
    etching the substrate with the gate electrode and the sidewall insulator film as a mask,
    wherein the impurity layers are formed after having etched the substrate and
    wherein the $Si_xGe_{1-x}$ layer is formed after having formed the impurity layers.

4. The method of claim 1, wherein the substrate is a silicon substrate and wherein the impurity is boron (B) whereas the metal is nickel (Ni).

5. A method of making a semiconductor device comprising:
    forming a gate insulating film above a semiconductive substrate;
    forming a gate electrode on the gate insulating film;
    forming in or on the substrate at both sides of the gate electrode a pair of spaced-apart heavily-doped impurity layers of p-type conductivity to a concentration ranging from $5\times10^{19}$ to $1\times10^{21}$ atoms per cubic centimeter (/cm$^3$); and
    forming a silicide layer by causing the impurity layers to react with a metal while simultaneously applying a compressive strain to the impurity layers;
    wherein the impurity layers have their lattice constant under application of the compressive strain, the lattice constant being deviated from a lattice constant in a state free from the compressive strain by 0.2 percent (%) or more and less than 1.0% or below.

6. A method of making a semiconductor device comprising:
    forming a gate insulating film above a semiconductive substrate;
    forming a gate electrode on the gate insulating film;
    forming in or on the substrate at both sides of the gate electrode a pair of spaced-apart heavily-doped impurity layers of n-type conductivity to a concentration ranging from $5\times10^{19}$ to $1\times10^{21}$ atoms per cubic centimeter (/cm$^3$);
    forming a silicide layer by causing the impurity layers to react with a metal while simultaneously applying a tensile strain to the impurity layers; and
    forming a $Si_xC_{1-x}$ (where $0 \leq x < 1$) layer in or on the substrate at the both sides of the gate electrode,
    wherein the impurity layers are formed in at least a region between the gate electrode and the $Si_xC_{1-x}$ layer.

7. The method of claim 6, further comprising
    forming a first sidewall insulator film on both side faces of the gate electrode,
    etching the substrate with the gate electrode and the first sidewall insulator film being as a mask, removing the first sidewall insulator film, and
    forming on the both faces of the gate electrode a second sidewall insulator film less in thickness than the first sidewall insulator film after having removed the first sidewall insulator film,
    wherein the $Si_xC_{1-x}$ layer is formed after etching the substrate and yet prior to removal of the first sidewall insulator film and wherein the impurity layers are formed by doping an impurity by ion implantation with the gate electrode and the second sidewall insulator film as a mask.

8. The method of claim 6, further comprising forming a sidewall insulator film on both side faces of the gate electrode, and etching the substrate with the gate electrode and the sidewall insulator film as a mask, wherein the impurity layers are formed after having etched the substrate and wherein the $Si_xC_{1-x}$ layer is formed after having formed the impurity layers.

9. The method of claim 6, wherein the substrate is a silicon substrate and wherein the impurity is arsenic (As) whereas the metal is nickel (Ni).

* * * * *